US010930063B2

(12) United States Patent
Pershing et al.

(10) Patent No.: US 10,930,063 B2
(45) Date of Patent: *Feb. 23, 2021

(54) AERIAL ROOF ESTIMATION SYSTEMS AND METHODS

(71) Applicant: Eagle View Technologies, Inc., Bothell, WA (US)

(72) Inventors: Chris Pershing, Redmond, WA (US); David P. Carlson, Bothell, WA (US)

(73) Assignee: Eagle View Technologies, Inc., Bothell, WA (US)

( * ) Notice: Subject to any disclaimer, the term of this patent is extended or adjusted under 35 U.S.C. 154(b) by 174 days.

This patent is subject to a terminal disclaimer.

(21) Appl. No.: 15/898,399

(22) Filed: Feb. 16, 2018

(65) Prior Publication Data
US 2018/0336722 A1 Nov. 22, 2018

Related U.S. Application Data

(63) Continuation of application No. 15/668,109, filed on Aug. 3, 2017, now abandoned, which is a (Continued)

(51) Int. Cl.
G06T 17/10 (2006.01)
G06Q 30/02 (2012.01)
(Continued)

(52) U.S. Cl.
CPC .............. *G06T 17/10* (2013.01); *G06F 30/13* (2020.01); *G06Q 10/06313* (2013.01);
(Continued)

(58) Field of Classification Search
None
See application file for complete search history.

(56) References Cited

U.S. PATENT DOCUMENTS 5,936,628 A    8/1999  Kitamura et al.
6,741,757 B1   5/2004  Torr et al.
(Continued)

FOREIGN PATENT DOCUMENTS

CA      2641373 A1    10/2009
WO   WO2009/046459 A1  4/2009

OTHER PUBLICATIONS

Hsieh, Yuan, Site City: A Semi-Automated Site Modeling System, 1996, IEEE. (Year: 1996).*
(Continued)

*Primary Examiner* — Cedric Johnson
(74) *Attorney, Agent, or Firm* — Dunlap Codding, P.C.

(57) ABSTRACT

Methods and systems for roof estimation are described. Example embodiments include a roof estimation system, which generates and provides roof estimate reports annotated with indications of the size, geometry, pitch and/or orientation of the roof sections of a building. Generating a roof estimate report may be based on one or more aerial images of a building. In some embodiments, generating a roof estimate report of a specified building roof may include generating a three-dimensional model of the roof, and generating a report that includes one or more views of the three-dimensional model, the views annotated with indications of the dimensions, area, and/or slope of sections of the roof. This abstract is provided to comply with rules requiring an abstract, and it is submitted with the intention that it will not be used to interpret or limit the scope or meaning of the claims.

16 Claims, 13 Drawing Sheets

Related U.S. Application Data continuation of application No. 15/345,358, filed on Nov. 7, 2016, now abandoned, which is a continuation of application No. 14/195,543, filed on Mar. 3, 2014, now Pat. No. 9,514,568, which is a continuation of application No. 13/287,954, filed on Nov. 2, 2011, now Pat. No. 8,670,961, which is a continuation of application No. 12/253,092, filed on Oct. 16, 2008, now Pat. No. 8,078,436, which is a continuation-in-part of application No. 12/148,439, filed on Apr. 17, 2008, now Pat. No. 8,145,578.

(60) Provisional application No. 60/925,072, filed on Apr. 17, 2007.

(51) Int. Cl.

| | |
|---|---|
| *G06T 17/20* | (2006.01) |
| *G06Q 10/06* | (2012.01) |
| *G06T 19/20* | (2011.01) |
| *G06T 11/60* | (2006.01) |
| *G06T 7/32* | (2017.01) |
| *G06T 7/33* | (2017.01) |
| *G06T 17/05* | (2011.01) |
| *G06T 7/593* | (2017.01) |
| *G06T 19/00* | (2011.01) |
| *G06F 30/13* | (2020.01) |

(52) U.S. Cl.
CPC ......... *G06Q 30/02* (2013.01); *G06Q 30/0283* (2013.01); *G06T 7/32* (2017.01); *G06T 7/337* (2017.01); *G06T 7/593* (2017.01); *G06T 11/60* (2013.01); *G06T 17/05* (2013.01); *G06T 17/20* (2013.01); *G06T 19/00* (2013.01); *G06T 19/20* (2013.01); *G06T 2200/08* (2013.01); *G06T 2207/10032* (2013.01); *G06T 2207/30184* (2013.01); *G06T 2210/04* (2013.01); *G06T 2219/004* (2013.01)

(56) References Cited

U.S. PATENT DOCUMENTS

| | | | |
|---|---|---|---|
| 7,305,983 B1 * | 12/2007 | Meder | G01W 1/12 126/621 |
| 7,428,337 B2 | 9/2008 | Gao et al. | |
| 7,509,241 B2 * | 3/2009 | Guo | G06T 17/05 703/2 |
| 8,538,151 B2 | 9/2013 | Shimamura et al. | |
| 8,538,918 B1 | 9/2013 | Pearcy et al. | |
| 9,129,376 B2 | 9/2015 | Pershing | |
| 9,135,737 B2 | 9/2015 | Pershing | |
| 9,279,602 B2 | 3/2016 | Kennedy et al. | |
| 2002/0010594 A1 | 1/2002 | Levine | |
| 2005/0129306 A1 | 6/2005 | Wang et al. | |
| 2006/0061566 A1 | 3/2006 | Verma et al. | |
| 2006/0235611 A1 | 10/2006 | Deaton et al. | |
| 2007/0058850 A1 | 3/2007 | Luo et al. | |
| 2007/0107242 A1 | 5/2007 | Montogmery | |
| 2012/0066187 A1 | 3/2012 | Pearcy et al. | |
| 2013/0216089 A1 | 8/2013 | Chen et al. | |
| 2013/0346020 A1 | 12/2013 | Pershing | |
| 2014/0046627 A1 | 2/2014 | Pershing | |
| 2014/0177945 A1 | 6/2014 | Pershing et al. | |
| 2015/0015605 A1 | 1/2015 | Pershing | |
| 2015/0016689 A1 | 1/2015 | Pershing | |
| 2015/0370928 A1 | 12/2015 | Pershing | |
| 2015/0370929 A1 | 12/2015 | Pershing | |

OTHER PUBLICATIONS

Applicad, "Product Overview: Sorcerer—Advanced Software for Roofing Modeling, Estimating, Presentation and Installation", Mar. 2, 2001, Issue 5. (Year: 2001).*

Perlant, Frederic P. et al, "Scene Registration in Aerial Image Analysis", Apr. 1990, Photogrammetric Engineering and Remote Sensing, vol. 56, No. 4, American Society for Photogrammetry and Remote Sensing. (Year: 1990).*

Eagle View Technologies, Inc. et al., Amended Appeal Brief regarding Reexamination No. 96/000,005 of U.S. Pat. No. 8,145,578, Jul. 27, 2017.

Eagle View Technologies, Inc., Response to USPTO Office Action regarding U.S. Appl. No. 13/954,832, filed Oct. 19, 2017.

Eagle View Technologies, Inc., Reply Brief in Ex Parte Reexamination Control No. 96/000,005 regarding U.S. Pat. No. 8,145,578 to Pershing et al.; filed Oct. 30, 2017.

Eagle View Technologies, Inc., "Brief in Support of Motion for Partial Summary Judgement that the Sungevity Reference is Not Prior Art to U.S. Pat. No. 8,078,436", (*Eagle View Technologies, Inc., and Pictometry International Corp.* v. *Xactware Solutions, Inc., and Verisk Analytics, Inc.*), in the United States District Court District of New Jersey, case No. njd-1-15-cv-07025-RBK-JS, dated Sep. 20, 2018.

Eagle View Technologies, Inc., "Opening Brief in Opposition of Defendants' Motion for Summary Judgement of Unpatentability", regarding U.S. Patents including U.S. Pat. No. 8,078,436, *Eagle View Technologies, Inc., and Pictometry International Corp.* v. *Xactware Solutions, Inc., and Verisk Analytics, Inc.*, in the United States District Court District of New Jersey, case No. njd-1-15-cv-07025-RBK-JS, dated Oct. 23, 2018.

Eagle View Technologies, Inc., Response to USPTO dated Jun. 21, 2017 Office Action regarding U.S. Appl. No. 13/371,271, filed Dec. 21, 2017.

Eagle View Technologies, Inc., Response to USPTO dated Nov. 29, 2016 Office Action regarding U.S. Appl. No. 13/371,271, filed May 26, 2017.

Eagle View Technologies, Inc., Response to USPTO dated May 10, 2018 Office Action regarding U.S. Appl. No. 13/371,271, filed Aug. 10, 2018.

Eagle View Technologies, Inc., Response to USPTO dated May 1, 2019 final Office Action regarding U.S. Appl. No. 13/371,271, filed Aug. 6, 2019.

Eagle View Technologies, Inc., Response to USPTO dated Apr. 20, 2017 Office Action regarding U.S. Appl. No. 13/954,832, dated Oct. 19, 2017.

Eagle View Technologies, Inc., Plaintiff's Amended Responsive Markman Brief in case of infringement of U.S. Patents including U.S. Pat. No. 8,078,436 (*Eagle View Technologies, Inc., and Pictometry International Corp.* v. *Xactware Solutions, Inc., and Verisk Analytics, Inc.*) in the United States District Court District of New Jersey, case No. njd-1-15-cv-07025-RBK-JS, dated Jul. 17, 2017.

Eagle View Technologies, Inc., Plaintiff's Opening Markman Brief in case of infringement of U.S. Patents including U.S. Pat. No. 8,078,436 (*Eagle View Technologies, Inc., and Pictometry International Corp.* v. *Xactware Solutions, Inc., and Verisk Analytics, Inc.*) in the United States District Court District of New Jersey, case No. njd-1-15-cv-07025-RBK-JS, dated Feb. 21, 2017.

Kugler, Robert, District Court Judge; Opinion regarding order granting Eagle View Technologies' motion to dismiss Inequitable Conduct Counter Claim and Affirmative Defense of Inequitable Conduct; *Eagle View Technologies, Inc. et al.* v. *Xactware Solutions, Inc. et al.*, 1:15-cv-07025, United States District Court for the District of New Jersey, Mar. 28, 2018.

Kugler, Robert, Markman Order regarding U.S. Patents including U.S. Pat. No. 8,078,436, *Eagle View Technologies, Inc., and Pictometry International Corp.* v. *Xactware Solutions, Inc., and Verisk Analytics, Analytics, Inc.*, in the United States District Court District of New Jersey, case No. njd-1-15-cv-07025-RBK-JS, dated Dec. 5, 2017.

USPTO, Examiner Answer regarding Reexamination No. 96/000,005 of U.S. Pat. No. 8,145,578, dated Aug. 29, 2017.

USPTO, Office Action regarding U.S. Appl. No. 13/954,832, dated Apr. 20, 2017.

(56) References Cited

OTHER PUBLICATIONS

USPTO, Office Action regarding U.S. Appl. No. 13/954,832, dated Jan. 25, 2018.
USPTO, Office Action regarding U.S. Appl. No. 13/371,271, dated May 10, 2018.
USPTO, Office Action regarding U.S. Appl. No. 13/371,271, dated Jun. 21, 2017.
USPTO, Office Action regarding U.S. Appl. No. 13/371,271, dated Oct. 5, 2018.
USPTO, Office Action regarding U.S. Appl. No. 13/371,271, dated May 1, 2019.
Vural et al., "Eastern Black Sea Region—A sample of modular design in the vernacular architecture," Science Direct, Building and Environment 42 (2007); pp. 2746-2761; [as cited in USPTO Jan. 25, 2018 Office Action regarding U.S. Appl. No. 13/954,832.
Xactware Solutions, Inc. et al., "Memorandum in Opposition to Eagle View Technologies, Inc.'s Motion for Partial Summary Judgement that the Sungevity Reference is Not Prior Art to U.S. Pat. No. 8,078,436", *Eagle View Technologies, Inc., and Pictometry International Corp. v. Xactware Solutions, Inc., and Verisk Analytics, Inc.*, in the United States District Court District of New Jersey, case No. njd-1-15-cv-07025-RBK-JS, dated Oct. 23, 2018.
Xactware Solutions, Inc. et al., "Memorandum in Support of Their Motion for Summary Judgement of Unpatentability" regarding U.S. Patents including U.S. Pat. No. 8,078,436, *Eagle View Technologies, Inc., and Pictometry International Corp. v. Xactware Solutions, Inc., and Verisk Analytics, Inc.*, in the United States District Court District of New Jersey, case No. njd-1-15-cv-07025-RBK-JS, dated Sep. 20, 2018.
Xactware Solutions, Inc., and Verisk Analytics, Inc., Defendant's Opening Markman Brief in case of infringement of U.S. Patents including U.S. Pat. No. 8,078,436 (*Eagle View Technologies, Inc., and Pictometry International Corp. v. Xactware Solutions, Inc., and Verisk Analytics, Inc.*) in the United States District Court District of New Jersey, case No. njd-1-15-cv-07025-RBK-JS, dated Feb. 21, 2017.
Xactware Solutions, Inc., and Verisk Analytics, Inc., Defendant's Responsive Markman Brief in case of infringement of U.S. Patents including U.S. Pat. No. 8,078,436 (*Eagle View Technologies, Inc., and Pictometry International Corp. v. Xactware Solutions, Inc., and Verisk Analytics, Inc.*) in the United States District Court District of New Jersey, case No. njd-1-15-cv-07025-RBK-JS, dated Jul. 13, 2017.
"Pictometry Announces Technical Advancements for GIS Professionals," retrieved on Sep. 7, 2016 from http://www.directionsmag.com/pressreleases/pictometry-announces-technical-advancements . . . , Dec. 7, 2006, Exhibit 2026 from IPR2016-00594, 10 pages.
Xactware Solutions, Inc., and Verisk Analytics, Inc., Defendants' Second Amended Answer to Amended Complaint, Affirmative Defenses, Counterclaim (*Eagle View Technologies, Inc., and Pictometry International Corp. v. Xactware Solutions, Inc., and Verisk Analytics, Inc.*) in the United States District Court District of New Jersey, case No. njd-1-15-cv-07025-RBK-JS, dated Feb. 28, 2017 (struck from court record Mar. 1, 2017).
Baillard, C. et al., "A Plane-Sweep Strategy for the 3D Reconstruction of Buildings from Multiple Images," 2000, International Archives of Photogrammetry and Remote Sensing, vol. XXXIII, Supplement B4.
Brooks et al., "A Review of Position Tracking Methods," 1st International Conference on Sensing Technology, Palmerston North, New Zealand, Nov. 21-23, 2005, pp. 54-59, 6 pages.
Canada Intellectual Property Office, Canadian Final Action for Canadian Application No. 2,641,373, dated Mar. 11, 2016.
Canada Intellectual Property Office, Canadian Office Action for Canadian Application No. 2,703,423, dated Mar. 24, 2014, 2 pages.
Cohasset, "Town Report," 2008, pp. 1-3 and 27, Exhibit 2010 from IPR2016-00594, 4 pages.
Eagle View Technologies, Inc. and Pictometry International Corp., "Sep. 23, 2015 Complaint (Case No. 15-cv-1725)," Exhibit 2003 of Patent Owner's Preliminary Response to Petition to institute IPR of U.S. Pat. No. 8,078,436 in IPR2016-01775, filed Jan. 19, 2017.
Eagle View Technologies, Inc., "Nov. 1, 2016 Deposition Transcript of H. Schuch," Exhibit 2005 of Patent Owner's Preliminary Response to Petition to institute IPR of U.S. Pat. No. 8,078,436 in IPR2017-00021, filed Jan. 23, 2017.
Eagle View Technologies, Inc., "Nov. 30, 2016 Hearing Transcript (Case No. 15-cv-7025)," Exhibit 2004 of Patent Owner's Preliminary Response to Petition to institute IPR of U.S. Pat. No. 8,078,436 in IPR2017-00021, filed Jan. 23, 2017.
Eagle View Technologies, Inc., "U.S. Pat. No. 8,078,436 Office Action in Ex Parte Reexamination, Jul. 25, 2013," Exhibit 2007 of Patent Owner's Preliminary Response to Petition to institute IPR of U.S. Pat. No. 8,078,436 in IPR2016-01775, filed Jan. 19, 2017.
"Website entitled CMU Libraries: Holdings: Design and evaluation of a semi-automated site," Exhibit 2005 of Patent Owner's Preliminary Response to Petition to institute IPR of U.S. Pat. No. 8,078,436 in IPR2016-01775, filed Jan. 19, 2017.
Eagle View Technologies, Inc., Patent Owner's Supplemental Preliminary Response to Petition to institute IPR of U.S. Pat. No. 8,078,436 in IPR2016-01775, filed Feb. 15, 2017.
Eagle View Technologies, Inc., Response in Ex Parte Reexamination Control No. 96/000,005 regarding U.S. Pat. No. 8,145,578, Jan. 25, 2017.
Eagle View Technologies, Inc., Response to Canadian Intellectual Property Office Final Action regarding Patent Application No. 2,641,373, dated Sep. 9, 2016.
Eagle View Technologies, Inc., Response to USPTO Office Action regarding U.S. Appl. No. 13/371,271, dated May 26, 2017.
Eagle View Technologies, Inc., Response to USPTO regarding U.S. Appl. No. 13/954,832, dated Dec. 12, 2016, filed May 26, 2017.
Geospatial Information Systems Council, "Pictometry: Oblique Imagery training," retrieved on Sep. 7 from http://www.ct.gov/gis/cwp/view.asp?q=425874&a=3033&pp=3, Last Modified on Apr. 6, 2009, 3 pages.
GIS, GIS Working Group Meeting Minutes, Jan. 22, 2007, Exhibit 2019 from IPR2016-00594, 16 pages.
Gisuser, "Los Angeles County Extends its License Agreement with Pictometry for New Oblique Aerial Photos," retrieved on Sep. 15, 2016 from http://www.directionsmag.com/pressreleases/los-angeles-county-extends-its-license-agree . . . , Mar. 6, 2006, Exhibit 2013 from IPR2016-00594, 4 pages.
Gisuser, "Pictometry Announces Technical Advancements for GIS Professionals," retrieved on Sep. 15, 2016 from http://gisuser.com/2006/12/pictometry-announces-technical-advancements-for-gis-professi . . . , Dec. 5, 2006, Exhibit 2025 from IPR2016-00594, 15 pages.
Henricsson et al., "Project Amobe: Strategies, Current Status and Future Work," International Archives of Photogrammetry and Remote Sensing, vol. XXXI, Part B3, Vienna, pp. 321-330, 1996, 10 pages.
IP Australia, Australian Office Action for Australian Application No. 2010219392, dated Oct. 1, 2013, 4 pages.
IP Australia, Australian Office Action for Australian Application No. 2011210538, dated Jun. 21, 2013, 3 pages.
IP Australia, Australian Office Action, for Australian Application No. 2013203507, dated Oct. 1, 2014, 3 pages.
Kennedy et al., Amendment and Response in U.S. Appl. No. 12/364,506, dated Oct. 18, 2012.
Kennedy et al., Amendment and Response in U.S. Appl. No. 12/364,506, dated Sep. 4, 2012.
Kennedy, U.S. Appl. No. 61/025,431, filed Feb. 13, 2008.
Kennedy, U.S. Appl. No. 61/047,086, filed Apr. 28, 2008.
Kwak, Tae-Suk et al., "Registration of Aerial Imagery and Aerial LiDAR Data Using Centroids of Plane Roof Surfaces as Control Information," Surveying and Geo-Spatial Information Engineering, KSCE Journal of Civil Engineering, vol. 10, No. 5., Sep. 2006.
Los Angeles County GIS Data Portal, LARIAC1 Pictometry Training, retrieved from http://egis3.lacounty.gov/dataportal/lariac/lariac-archives/lariac1-archive/lariac1-pictometr . . . , retrieved Sep. 15, 2016, 1 page, Exhibit 2011 from IPR2016-00594.

(56) References Cited

OTHER PUBLICATIONS

Los Angeles Region Imagery Acquisition Consortium, LAR-IAC2 Product Guide, for the Los Angeles Region Imagery Acquisition Consortium (LAR-IAC) Program, 2008-09, Exhibit 2012 from IPR2016-00594, 16 pages.
Merriam-Webster, "Compass Bearing," Definition, 2 pages.
PCT/ISA, International Search Report and Written Opinion of the International Searching Authority for International Application No. PCT/US2013/024523, dated Nov. 13, 2013, 15 pages.
Perlant et al., "Scene Registration in Aerial Image Analysis," retrieved on Sep. 7, 2016 from http://proceedings.spiedigitallibrary.org/proceedings.aspx?articleid=1257182, Jul. 25, 1989, 3 pages.
Pershing et al., Amendment for U.S. Appl. No. 14/195,543, dated Jun. 29, 2016, 13 pages.
Pershing et al., Amendment for U.S. Reexamination U.S. Appl. No. 96/000,005, dated Apr. 25, 2016, 53 pages.
Pershing et al., Amendment for U.S. Reexamination U.S. Appl. No. 96/000,005, dated Aug. 18, 2014, 164 pages.
Pershing et al., Amendment for U.S. Reexamination U.S. Appl. No. 96/000,005, dated Sep. 16, 2014, 17 pages.
Petitioner's Request for Rehearing Pursuant to 37 C.F.R. §§ 42.71 (c) and (d), Case IPR2016-00582, U.S. Pat. No. 8,078,436 B2, Sep. 9, 2016, 12 pages.
Pictometry, "Oblique Image Library Instructions—Information for Utilization," Oct. 2008, 8 pages.
Pictometry, "Power Point Presentation," Apr. 19, 2007, Exhibit 2022 from IPR2016-00594, 20 pages.
Pictometry, "Welcome to Your End User Training Power Point Presentation," Exhibit 2023 from IPR2016-00594, 46 pages.
Pictometry, Pictometry Administrative Training, Exhibit 2014 from IPR2016-00594, 39 pages.
Pictometry, Pictometry Administrative Training, Handout, Exhibit 2016 from IPR2016-00594, 1 page.
Pictometry, Pictometry Administrative Training, Metadata, Exhibit 2015 from IPR2016-00594, 1 page.
Pictometry, Pictometry License Guidelines, Jan. 26, 2005, Exhibit 2021 from IPR2016-00594, 2 pages.
PTAB, Decision—Denying Institution of Inter Partes Review 2017-00021, Paper 9, filed Apr. 14, 2017.
SPIE, "About the SPIE Digital Library", http://spiedigitallibrary.org/ss/about.aspx, Sep. 7, 2016, 3 pages.
SPIE, "Proceedings of SPIE," retrieved from http://proceedings.spiedigitallibrary.org/conferenceproceedings.aspx, retrieved on Sep. 7, 2016, 3 pages.
USPTO, Advisory Action in Ex Parte Reexamination Control No. 96/000,005 regarding U.S. Pat. No. 8,145,578, dated Feb. 17, 2017.
USPTO, Applicant-Initiated Interview Summary for U.S. Appl. No. 13/371,271, dated Jul. 29, 2013, 2 pages.
USPTO, Ex Parte Reexamination Interview Summary for Control No. 96/000,005 regarding U.S. Pat. No. 8,145,578, dated Jan. 19, 2017.
USPTO, Final Office Action in Ex Parte Reexamination Control No. 96/000,005 regarding U.S. Pat. No. 8,145,578, dated Nov. 25, 2016.
Pershing et al., Issue Fee Payment with Comments for U.S. Appl. No. 13/371,271, Jul. 30, 2013, 7 pages.
USPTO, Non-Final Office Action for U.S. Appl. No. 14/195,543, dated Mar. 29, 2016, 25 pages.
USPTO, Notice of Allowance for U.S. Appl. No. 12/364,506 to Kennedy, dated Dec. 12, 2012.
USPTO, Notice of Intent to Issue Reexam Certificate for U.S. Reexamination U.S. Appl. No. 96/000,004, dated Apr. 16, 2014, 43 pages.
USPTO, Notice of Non-Compliant Amendment for U.S. Appl. No. 12/364,506 (Kennedy), dated Sep. 18, 2012, 2 pages.
USPTO, Notification of Reopening of Prosecution Due to Consideration of an Information Disclosure Statement Filed After Mailing of a Notice of Allowance for U.S. Appl. No. 13/371,271, dated Aug. 14, 2013, 3 pages.
USPTO, Office Action for U.S. Appl. No. 13/371,271, dated Jan. 2, 2015, 19 pages.
USPTO, Office Action for U.S. Appl. No. 13/371,271, dated Nov. 29, 2016, 50 pages.
USPTO, Office Action for U.S. Appl. No. 13/954,832, dated Apr. 20, 2017, 26 pages.
USPTO, Office Action for U.S. Appl. No. 15/345,358, dated Jan. 19, 2017, 10 pages.
Xactware Solutions, Inc., "Feb. 9, 2016 Defendants Invalidity Contentions (Case No. 15-cv-7025)," Exhibit 2001 of Patent Owner's Preliminary Response to Petition to institute IPR of U.S. Pat. No. 8,078,436 in IPR2017-00021, filed Jan. 23, 2017, 165 pages.
Xactware Solutions, Inc., "Nov. 30, 2016 Motion to Stay Hearing Slides (Case No. 15-cv-1725)," Exhibit 2001 of Patent Owner's Preliminary Response to Petition to institute IPR of U.S. Pat. No. 8,078,436 in IPR2016-01775, filed Jan. 19, 2017, 25 pages.
Xactware Solutions, Inc., and Verisk Analytics, Inc., Defendant's Second Amended Answer, Affirmative Defenses, Counterclaims, and Jury Demand in response to Complaint for infringement of U.S. Patents including U.S. Pat. No. 8,078,436 in litigation (*Eagle View Technologies, Inc., and Pictometry International Corp.* v. *Xactware Solutions, Inc., and Verisk Analytics, Inc.*) in the United States District Court District of New Jersey, case No. njd-1-15-cv-07025-RBK-JS, dated May 18, 2017.
Maiamelissa, YouTube, Screenshot "Pictometry Online Webinar for MAIA Members," uploaded Apr. 8, 2011, retrieved from http://www.youtube.com/watch?v=RzAXK2avqQQ, 2 pages.

\* cited by examiner

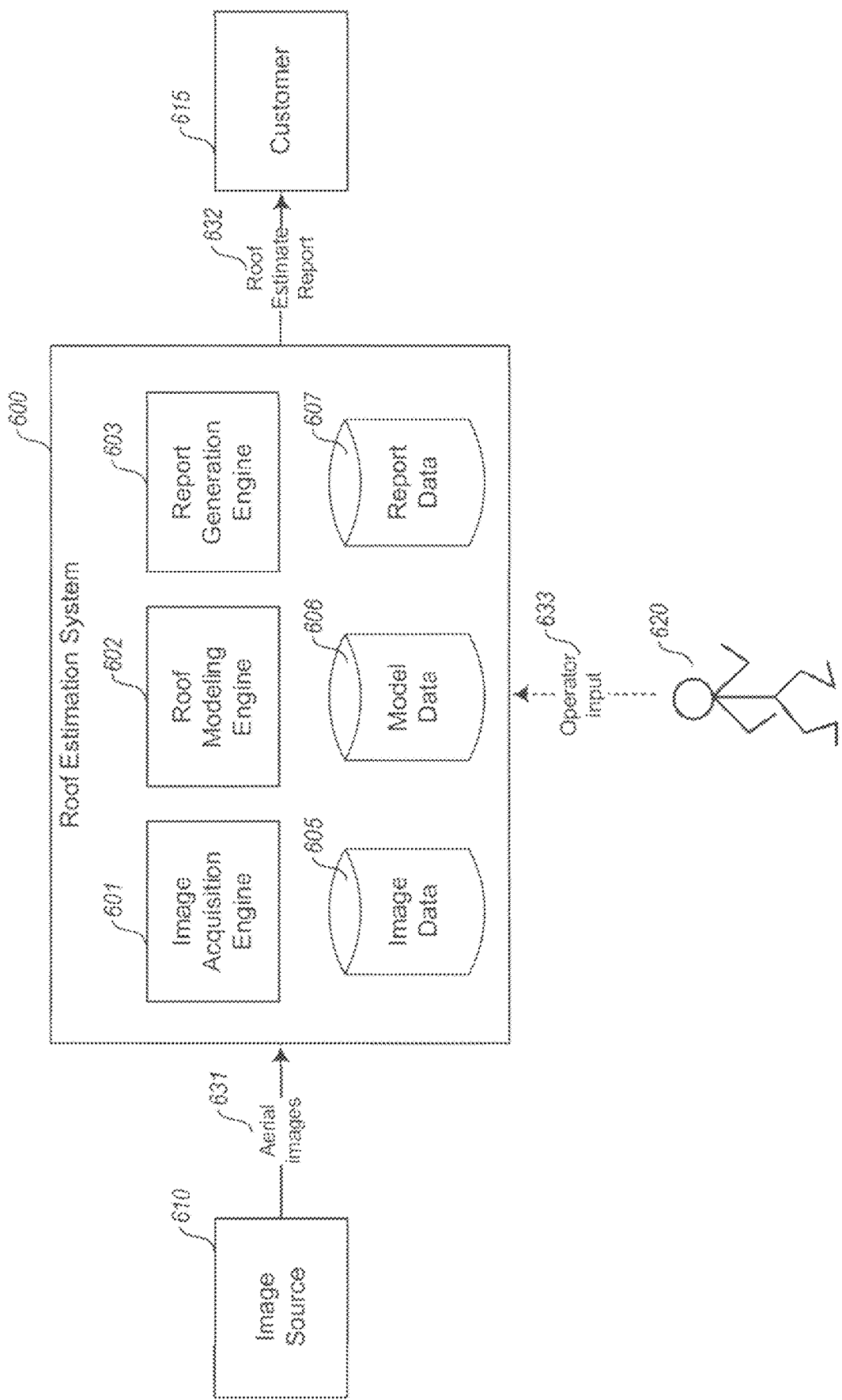

AERIAL ROOF ESTIMATION SYSTEMS AND METHODS

CROSS REFERENCE TO RELATED APPLICATION/INCORPORATION BY REFERENCE

The present patent application is a continuation of and claims priority to U.S. patent application Ser. No. 15/668,109, filed Aug. 3, 2017, which is a continuation of and claims priority to U.S. patent application Ser. No. 15/345,358, filed Nov. 7, 2016, which is a continuation of and claims priority to U.S. patent application Ser. No. 14/195,543, filed Mar. 3, 2014, which issued as U.S. Pat. No. 9,514,568, which is a continuation of and claims priority to U.S. patent application Ser. No. 13/287,954, filed Nov. 2, 2011, which issued as U.S. Pat. No. 8,670,961, which is a continuation of and claims priority to U.S. patent application Ser. No. 12/253,092, filed Oct. 16, 2008, which issued as U.S. Pat. No. 8,078,436, which is a continuation-in-part of and claims priority to U.S. patent application Ser. No. 12/148,439, filed Apr. 17, 2008, which issued as U.S. Pat. No. 8,145,578, which claims priority to the provisional patent application identified by U.S. Ser. No. 60/925,072, filed Apr. 17, 2007, the entire contents of each of which are hereby expressly incorporated by reference herein.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Field of the Invention

This invention relates to systems and methods for estimating construction projects, and more particularly, to such systems and methods that allow estimates involving roofs on buildings to be created remotely.

1. Description of the Related Art

The information provided below is not admitted to be part of the present invention, but is provided solely to assist the understanding of the reader.

Homeowners typically ask several roofing contractors to provide written estimates to repair or replace a roof on a house. Heretofore, the homeowners would make an appointment with each roofing contractor to visit the house to determine the style of roof, take measurements, and to inspect the area around the house for access and cleanup. Using this information, the roofing contractor then prepares a written estimate and then timely delivers it to the homeowner. After receiving several estimates from different rooting contractors, the homeowner then selects one.

There are factors that impact a roofing contractor's ability to provide a timely written estimate. One factor is the size of the roof contractor's company and the location of the roofing jobs currently underway. Most roof contractors provide roofing services and estimates to building owners over a large geographical area. Larger roof contractor companies hire one or more trained individuals who travel throughout the entire area providing written estimates. With smaller roofing contractors, the owner or a key trained person is appointed to provide estimates. With both types of companies, roofing estimates are normally scheduled for buildings located in the same area on a particular day. If an estimate is needed suddenly at a distant location, the time for travel and the cost of commuting can be prohibitive. If the roofing contractor is a small company, the removal of the owner or key person on a current job site can be time prohibitive.

Another factor that may impact the roofing contractor's ability to provide a written estimate is weather and traffic.

Recently, solar panels have become popular. In order to install solar panels, the roof's slope, geometrical shape, and size as well as its orientation with respect to the sun all must be determined in order to provide an estimate of the number and type of solar panels required. Unfortunately, not all roofs on a building are proper size, geometrical shape, or orientation for use with solar panels.

SUMMARY

These and other objects are met by the system and method disclosed herein that allows a company that needs the sizes, dimensions, slopes and orientations of the roof sections on a building in order to provide a written estimate. A roof estimation system ("RES") that practices at least some of the techniques described herein may include a roof estimating software program and a location-linked, image file database. During use, the physical address or location information of a building is provided to the program, which then presents aerial images of roof sections on the building at the specific address location. An overhead aircraft, a balloon, or satellite may produce the aerial images. An image analysis and calibration is then performed either manually and/or via a software program that determines the geometry, the slopes, the pitch angles, and the outside dimensions of the roof sections. The images may also include the land surrounding the roof sections and building which the estimating company can use to factor in additional access or clean-up costs.

In a first embodiment of the roof estimation system, a roof estimation service is contacted by a potential customer requesting an estimate for repair or replacement of a roof on a building. The roof estimation service uses a local computer with an estimating software program loaded into its working memory to access an image file database located on the computer or on a remote server connected via a wide area network to the local computer. The image file database contains image files of various buildings. When a request for an estimate is received from a potential customer, the roof estimation service enters the customer's address into the software program and aerial images of the building are then presented to the roof estimation service. The roof estimation service then manually measures or uses a roof estimation software program to determine the slopes, dimensions, and other relevant geometric information of the roof sections on the buildings. From these determinations, the overall shape, slopes and square footage of the roof sections are determined and a report is produced. After the report has been prepared, the images are reviewed again for special access and cleanup tasks which can be added to the final estimate before transmission to the potential customer.

In another embodiment, the roof estimate software program and image file database, operated by a roof estimation service, are both stored on one or more a remote computers and accessed by a roof company, via a wide area network. The roof company uses an assigned user name and password to log onto the Web site and accessed the computer. After logging on, the roof company submits an address of a building, other relevant job related information, and a request for a report from the roof estimation service. The roof estimation service associated with the Web site uses the address information to obtain the images of the roof sections on the building(s) and uses the roof estimation software program and calibration module to determine the relevant geometry, pitch angles, dimensions, and surface areas of the building's roof. The roof estimation service then produces and sends a report to the roof company. The roof company then uses the report to prepare a final estimate that is then delivered to its potential customer.

In another embodiment, a roof estimating Web site is created designed to receive requests for roof estimates directly from potential customers in a region. The roof estimation service that operates the Web site is associated with various roof companies that provide roof-related services in the region serviced by the Web site. When a potential customer contacts the Web site and requests an estimate for a roof repair, replacement or installation of equipment, the potential's customer's name, address, and contact information is first submitted on the Web site. The estimation service representative enters the address of the building into the roof estimation software program. The aerial images of the buildings are then obtained and analyzed by the service representative to extract the relevant geometric information about the structures. A report containing the geometric information obtained from the aerial images and other relevant project related information supplied by the potential customer are transmitted to roof companies associated with the estimation service. The roof company reviews the information then prepares an estimate which then can be uploaded to the roof estimating Web site server which then forwards the estimate to the potential customer, or sent from the roof company directly via email, fax or mail to the potential customer.

In another embodiment, a roof estimation service associated with the roof estimate Web site uses the image file database and roof estimate software to preemptively calculate and store the dimensions, areas, pitch angles, and other relevant geometric information about the buildings and structures located within a geographic region. This pre-calculated information can then be used by any of the previously mentioned embodiments to accelerate the process of obtaining roof estimates within that geographic region.

It should be understood, that the systems and methods described herein may be used by any individual or company that would find the calculation of the size, geometry, pitch and orientation of the roof of a building from aerial images of the building useful. Such companies may include roofing companies, solar panel installers, roof gutter installers, awning companies, HVAC contractors, general contractors, and insurance companies.

BRIEF DESCRIPTION OF THE DRAWINGS

FIG. 6 is a block diagram illustrating example functional elements of one embodiment of a roof estimation system.

DETAILED DESCRIPTION

Figure 1:
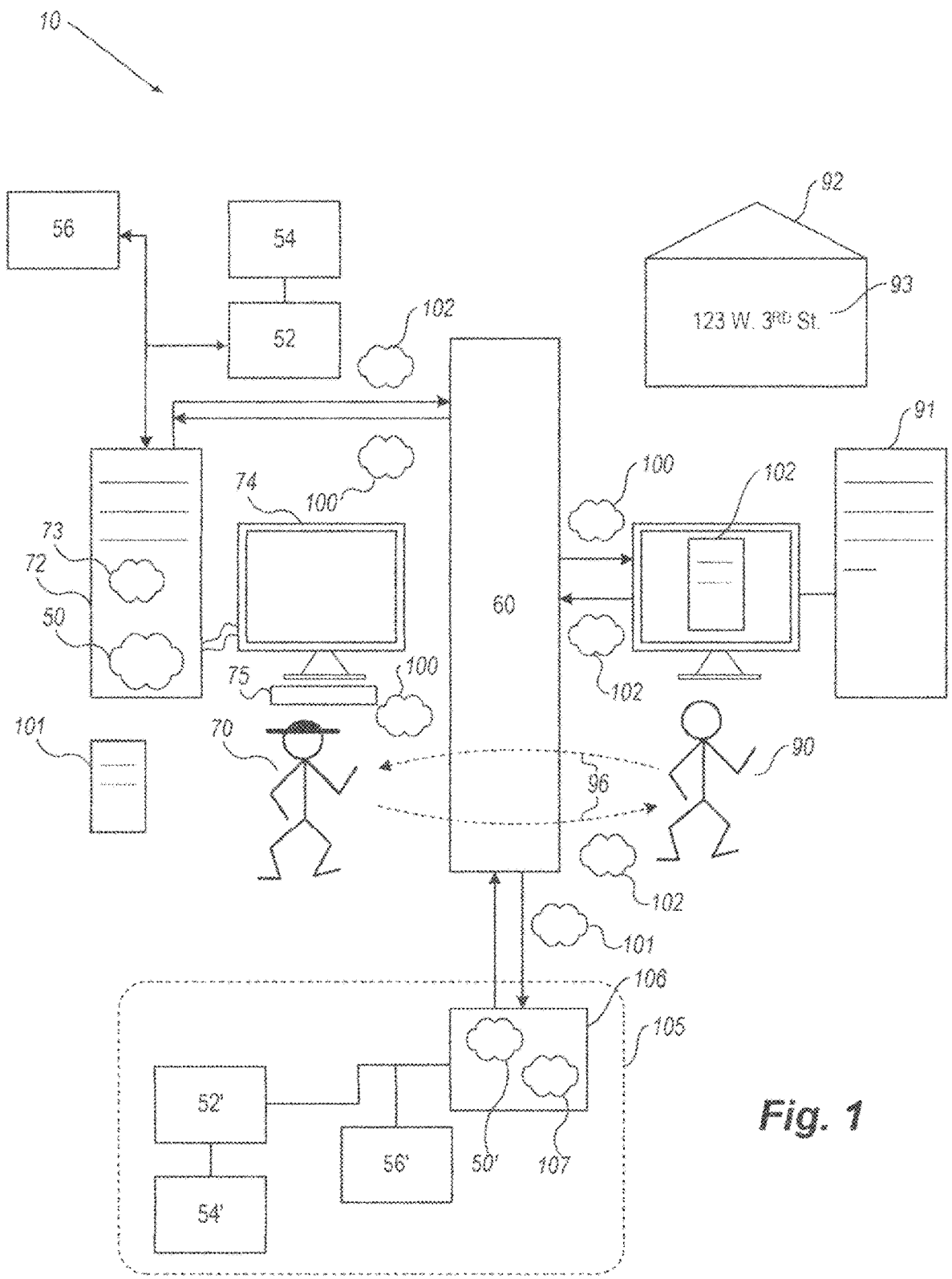
FIG. 1 is an illustration showing embodiments of a system and method for roof estimation.
Figure 3:
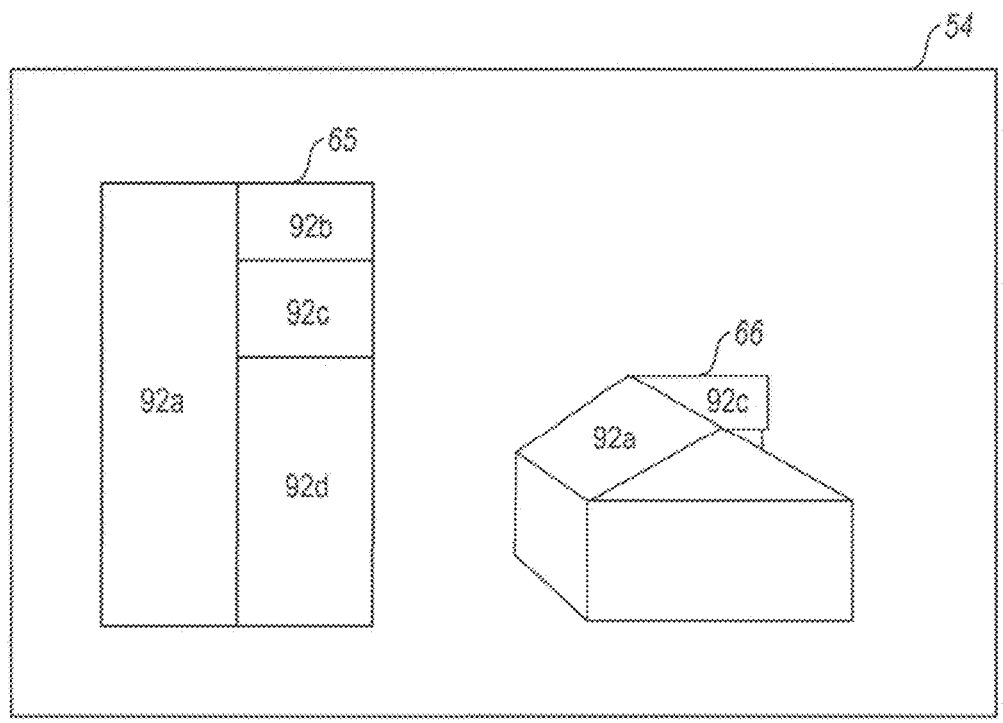
FIG. 3 is an illustration showing the top and perspective view of a house for a particular address.

Referring to the accompanying Figures, there is described a roof estimation system ("RES") 10 and method that allows a roof estimation service 70 to provide a final estimate 102 to a potential customer 90 to install equipment or to repair or replace the roof on a building 92 using aerial images of the building 92, as shown in FIG. 1. The roof estimation service 70 may be any service that provides roof estimates to customers. In one embodiment, the roof estimation service 70 typically provides roof estimates to customers who are roof companies or other entities involved in the construction and/or repair of roofs, such as builders, contractors, etc. In another embodiment, the roof estimation service 70 is a roof company that is directly involved in the construction and/or repair of roofs, and that provides estimates to customers that are property owners, general contractors, etc. The system 10 includes an estimating software program 50 designed to receive an address for the building 92. The software program 50 is linked to an aerial image file database 52 that contains aerial images files 54 of various building 92 in a region. The aerial image files 54 may be taken any available means, such as a manned or unmanned aircraft, a balloon, a satellite, etc. In some embodiments, the aerial image files may include images taken from a ground-based platform, such as a mobile ("street view") photography vehicle, a fixed position (e.g., a tower, nearby building, hilltop, etc.), etc. As shown in FIG. 3, the image files 54 typically include at least one a top plan view 65 and a perspective view 66 of the building 92. The roof of the building 92 includes multiple planar roof sections 92a-92d.

Figure 4:
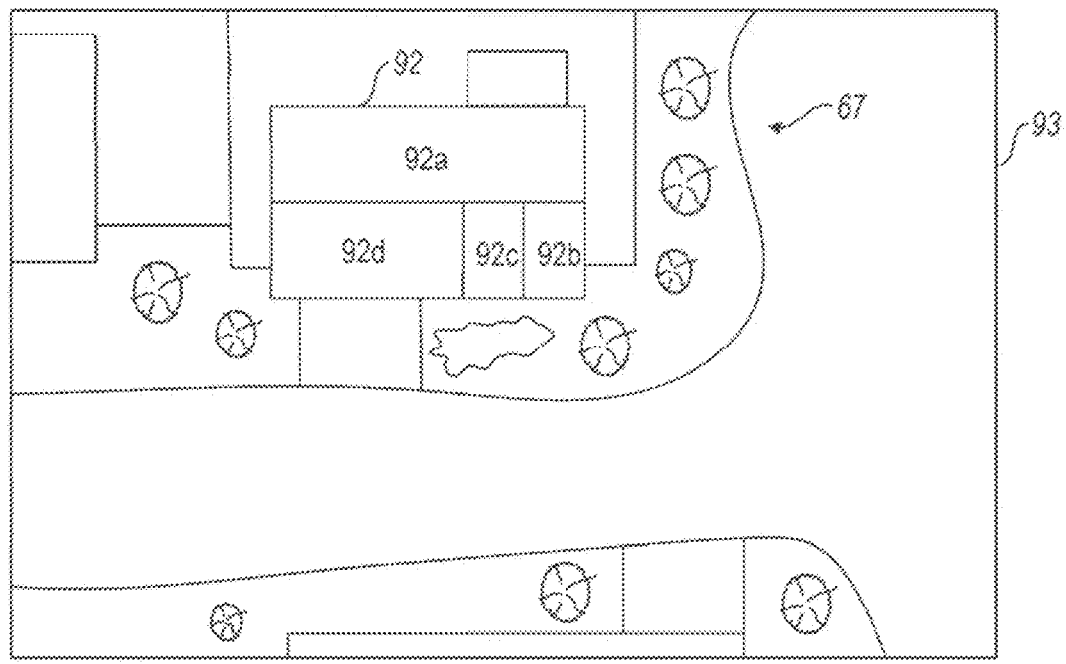
FIG. 4 is an aerial image of the home shown in FIG. 3 showing the areas and structures around the home.

As shown in FIG. 4, the image files 54 may also include a wide angle image 67 showing the building 92 and the surrounding areas 93 around the building 92.

Referring back to FIG. 1, in one embodiment, an image analysis and calibration module 56 is linked to the software program 50 that enables the roof estimation service 70 to closely estimate the dimensions and slopes of the roofs of the buildings 92 shown in the views 65, 66. By simply inputting the customer's address into the software program 50, the roof estimation service 70 is able view the customer's roof from the aerial image files 54 using a remote computer 72, determine the dimensions and slopes of the roof sections that make up the roof, and prepare a preliminary report 101 which is then used to prepare a final estimate 102 that is then delivered to the potential customer 90.

FIG. 1 is an illustration showing the system 10 used by a potential customer 90 requesting a roof estimate from a roof estimation service 70 that uses the system 10 described above. The potential customer 90 may be the building tenant, owner or insurance company. The roof estimation service 70 uses a computer 72 which may connect to a wide area network 60. The customer 90 contacts the roof estimation service 70 via his or her computer 91 and the wide area network 60 or by a telecommunication network 96, and requests a roof estimate 100 for his building 92 located at a public address 93. (in this example, "123 W. 3rd St."). The roof estimation service 70 then processes the request 100 which leads to a final estimate 102 being delivered to the potential customer's computer 91 or via email, fax or postal service to the potential customer 90.

There are several different ways the system 10 can be setup. FIG. 1 shows a first embodiment of the system 10 where the roof estimation service 70 operates a remote computer 72 with a display 74 and a keyboard 75 or similar input means, such as a mouse, joystick, track pad, etc. A roof estimating software program 50 is loaded into the working memory 73 of the remote computer 72. The software program 50 is able to retrieve aerial images of buildings from the database 52 containing aerial images files 54 of buildings located in the region served by the roof estimation service 70. In the first embodiment shown in FIG. 1, the remote computer 72 is linked or connected to a database 52 containing aerial images files 54 of the buildings. The software program 50 includes a calibration module 56 that enables the roof estimation service 70 to determine the angles and dimensions of various roof sections shown in the images files 54. After the angles and dimensions are determined, the combined square footage of the building 92 can be determined which is then used to create a preliminary report 101. The roof estimation service 70 then reviews the wide angle image file 67 (see FIG. 4) to determine if the building 92 has special access and clean up factors that may impact the final estimate 102. Once the preliminary report 101 or the final estimate 102 is prepared by the roof estimation service 70, one or both can be transmitted to the customer 90 via the wide area network 60, the telecommunication network 96, or by postal service.

Also shown in FIG. 1 is an alternative setup of the system 10 wherein a preliminary report 101 is prepared by a separate roof estimating entity 105 which is then forwarded to the roof estimation service 70 who then prepares the final estimate 102 and sends it to the customer 90. The entity 105 includes a computer 106 with a roof estimating software program 50' loaded into the working memory 107. Like the software program 50 loaded into the roof contractor's computer 72 in the previous embodiment the software program 50' is also able to retrieve aerial images of houses from a database 52' containing aerial images files 54' of houses located in the region served by the roof estimation service 70. An optional calibration module 56' may be provided which enables the entity 105 to determine the angles and linear dimensions of various roof sections on the house 92.

When the system 10 is set up to include the estimating entity 105, the customer 90 may first contact the roof estimation service 70. The roof estimation service 70 may then contact the estimating entity 105 and forward the address of the building 92 thereto. The estimating entity 105 may then prepare the preliminary report 101 that is transmitted to the roof estimation service 70. The roof estimation service 70 may then prepare the final report 102 and send it to the customer 90. In other embodiments, interactions between the customer 90, the roof estimation service 70, and the estimating entity 105 may occur in different ways and/or orders. For example, the customer 90 may contact the estimating entity 105 directly to receive a final report 102, which the customer 90 may then forward to one or more roof companies of their choosing.

Figure 2:
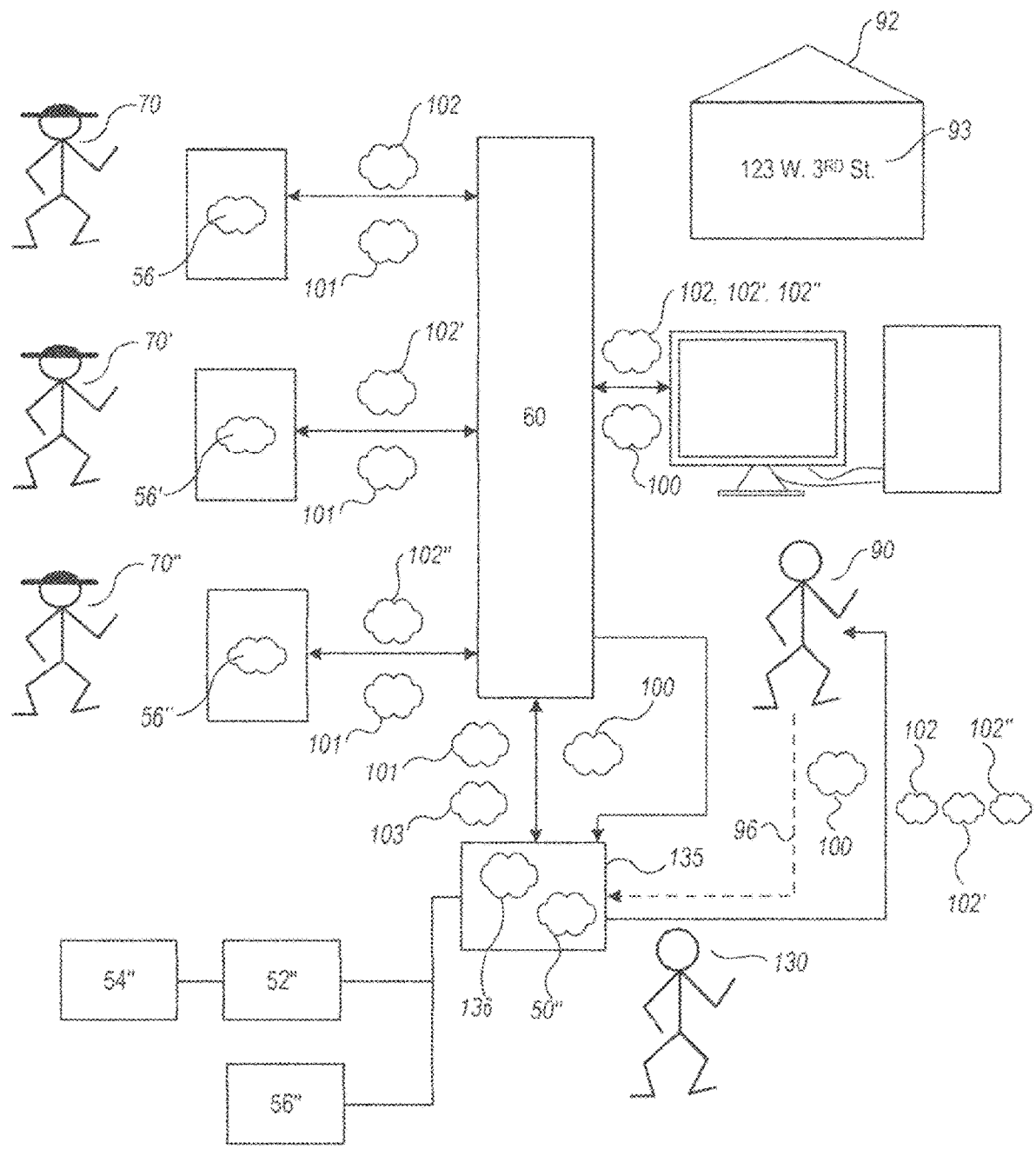
FIG. 2 is an illustration showing another embodiment of a system and method for roof estimation.

FIG. 2 shows a third embodiment of the system 10 where the customer 90 contacts a roof estimating entity 130 who receives a request 100 from the customer 90 via the wide area network 60 or telecommunication network 96. The roof estimating entity 130 prepares a preliminary report 101 which is then transmitted to various roof estimation services 70, 70', 70" associated with the entity 130. Accompanying the preliminary report 101 may be the name and contact telephone number(s) or email address of the customer 90. Each roof estimation service 70, 70', 70" reviews the preliminary report 101 and any associated images sent therewith and then prepares a final estimate 102, 102', 102". The final estimate 102, 102', 102" is then mailed, emailed or faxed to the customer 90 or back to the estimating entity 130. The estimating entity 130 then sends the final estimate 102, 102', 102" to the customer 90. In this embodiment, the estimating entity 130 includes a computer 135 in which the roof estimating software program 50" is loaded into its working memory 136 loaded and linked to the aerial image database 52" containing image files 54". An optional calibration module 56" may be loaded into the working memory 136 of the computer 135.

Figure 5A:
FIGS. 5A-5F are consecutive pages from a preliminary or final report sent to a potential customer prepared by the roofing company.
Figure 5B:
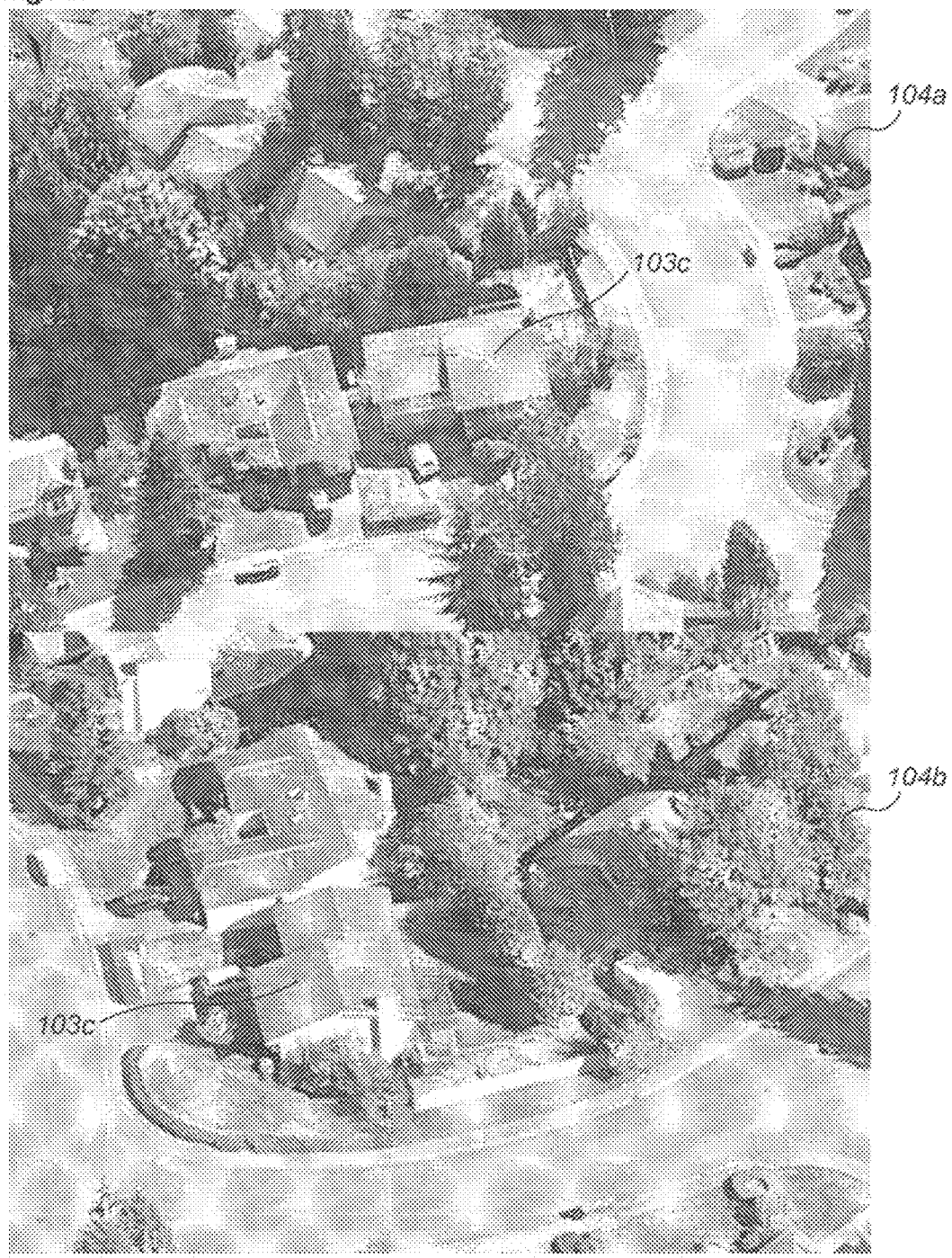
Figure 5C:
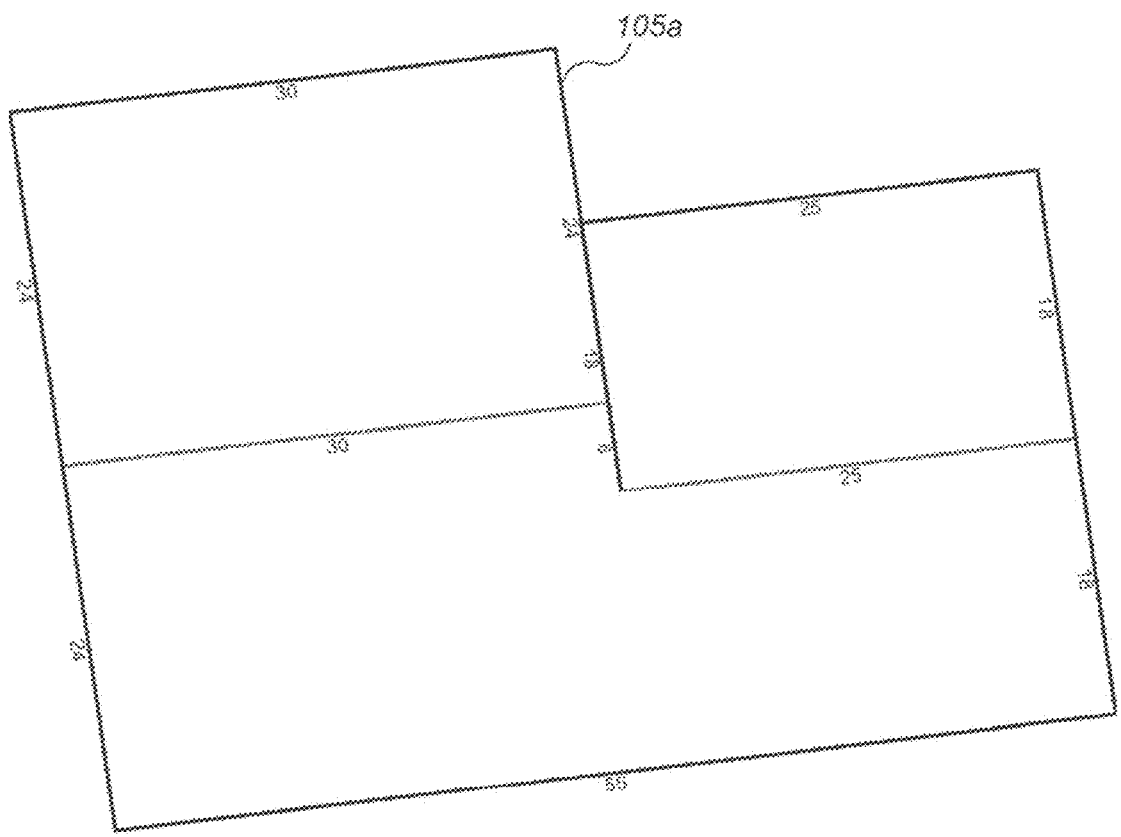
Figure 5D:
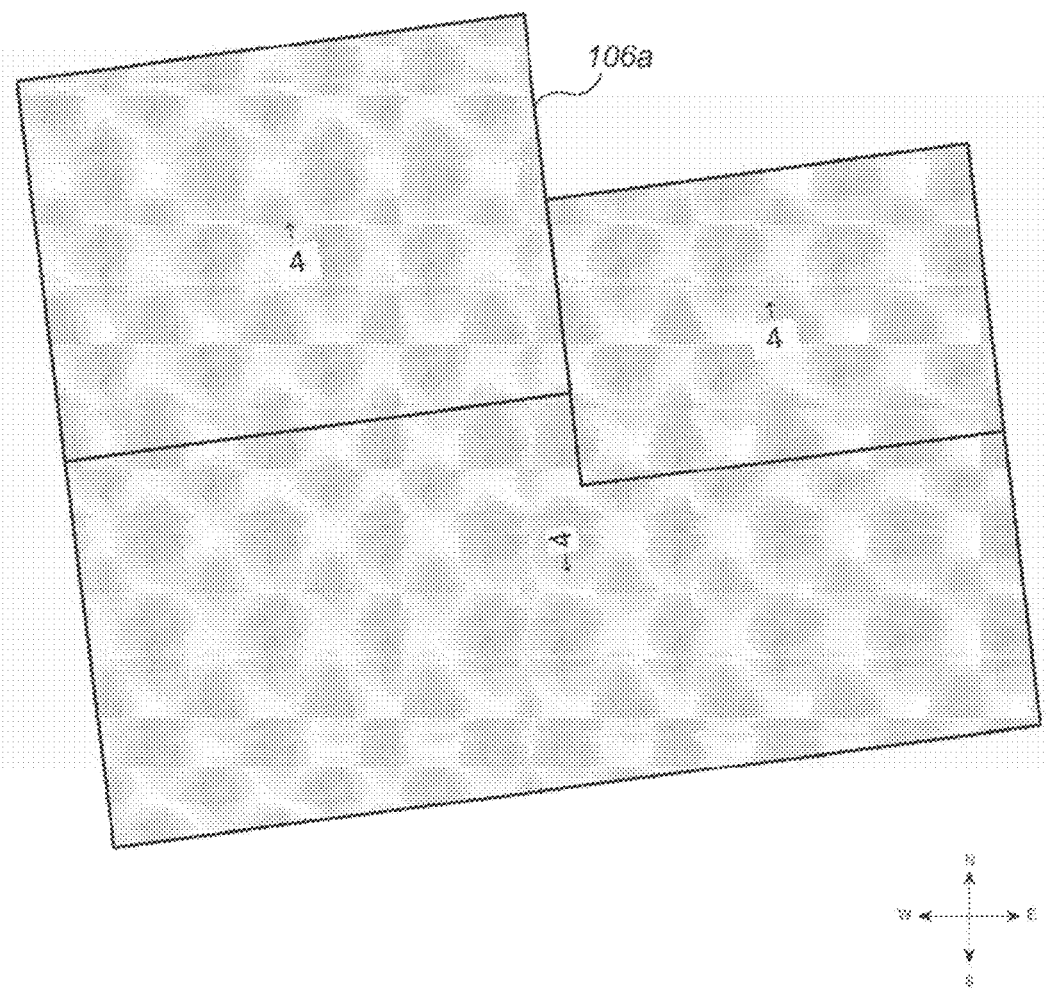
Figure 5E:
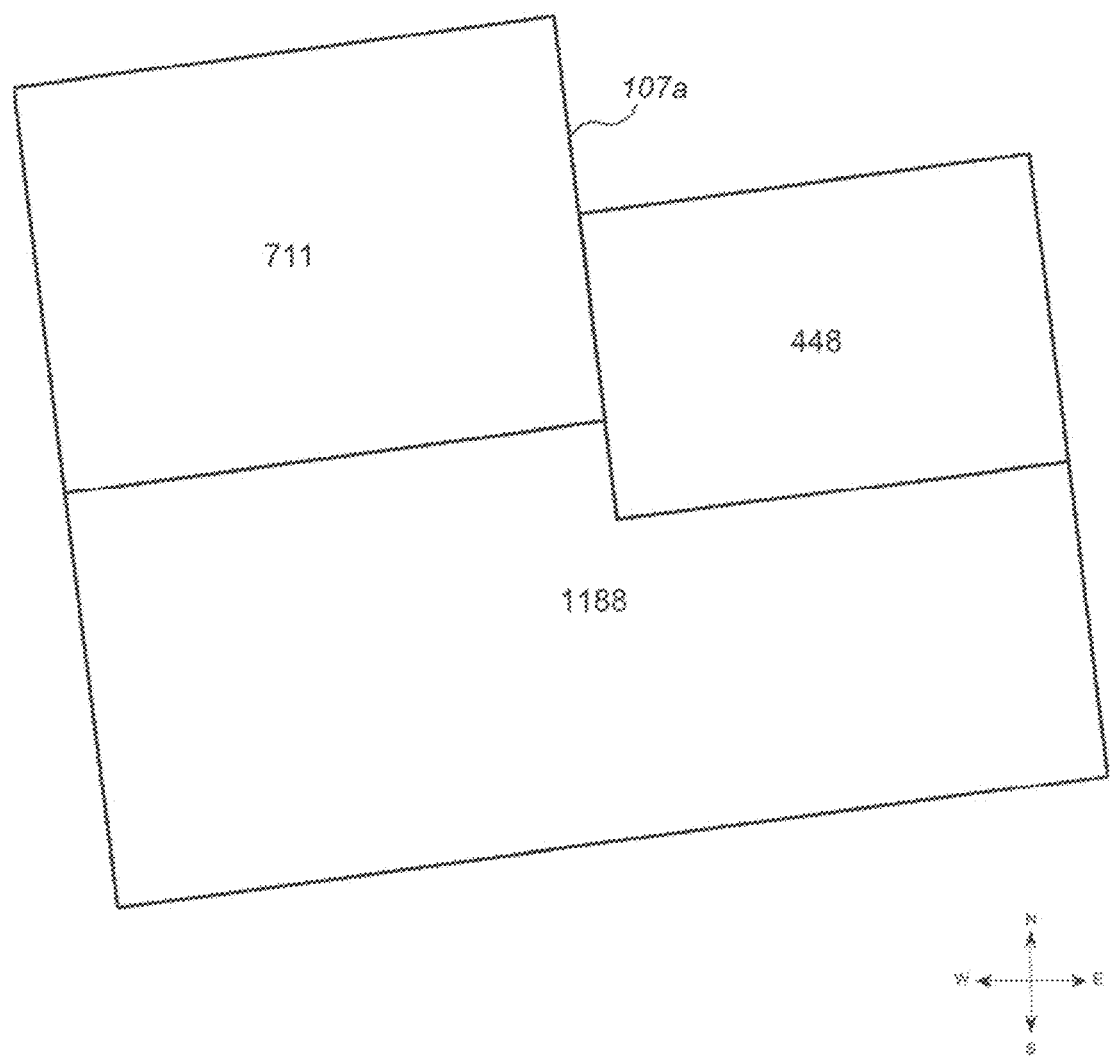
Figure 5F:
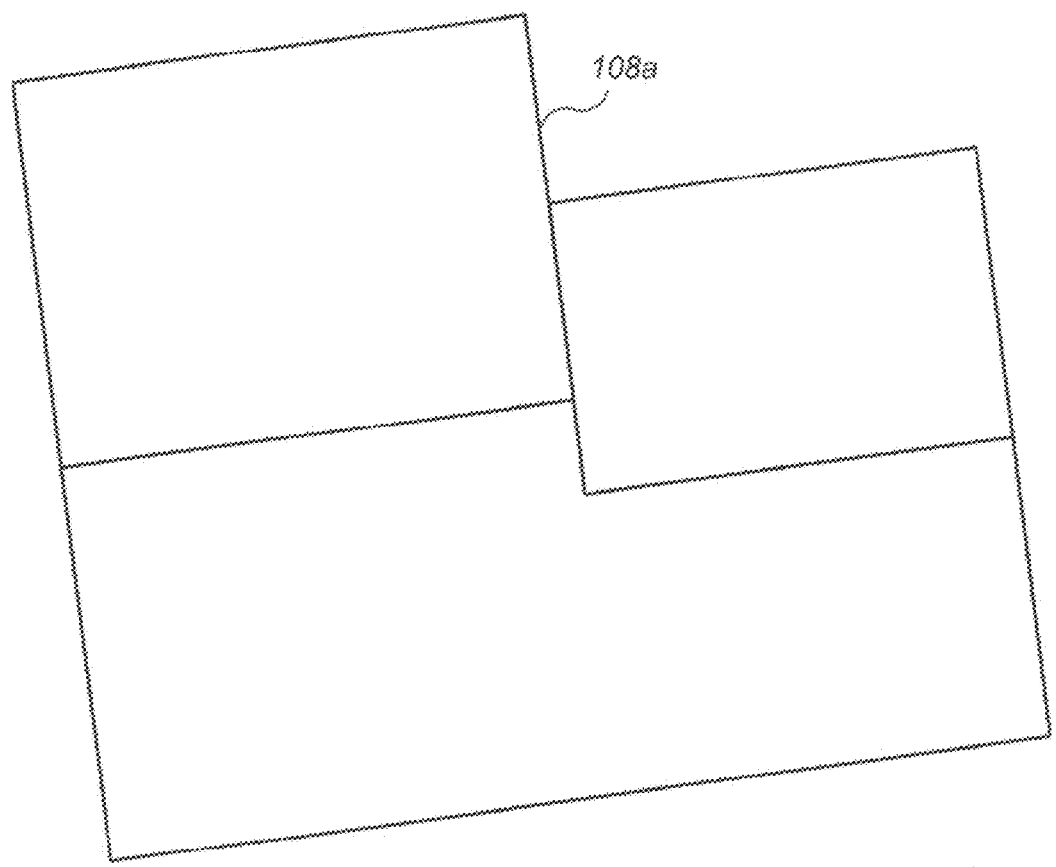

FIGS. 5A-5F are individual pages that make up a representative report. In FIG. 5A, a cover page 103 that lists the address 103a of a building 103c and an overhead aerial image 103b of the building 103c. In FIG. 5B, a second page 104 of the report is shown that shows two wide overhead perspective views 104a and 104b of the building 103c at the address with the surrounding areas more clearly shown. FIG. 5C is the third page 105 of the report which shows a line drawing 105a of the building showing ridge and valley lines, dimensions and a compass indicator. FIG. 5D is an illustration of the fourth page 106 of the report showing a line drawing 106a of the building showing the pitch of each roof section along with a compass indicator. The pitch in this example is given in inches, and it represents the number of vertical inches that the labeled planar roof section drops over 12 inches of horizontal run. The slope can be easily calculated from such a representation using basic trigonometry. The use of a numerical value of inches of rise per foot of run is a well known measure of slope in the roofing industry. A roof builder typically uses this information to assist in the repair and/or construction of a roof. Of course, other measures and/or units of slope may be utilized as well, including percent grade, angle in degrees, etc. FIG. 5E is an illustration of the fifth page 107 of the report showing a line drawing 107a of the building showing the square footage of each roof section along with the total square foot area value. FIG. 5F is an illustration of a sixth page 108 of the report showing a line drawing 108a of the building where notes or comments may be written.

Using the above roof estimation system, a detailed description of how the system may be used in one example embodiment is now provided.

First, a property of interest is identified by a potential customer of the roof estimation service 70. The customer may be a property owner, a roof construction/repair company, a contractor, an insurance company, a solar panel installer, etc. The customer contacts the roof estimation service with the location of the property. Typically, this will be a street address. The roof estimation service 70 may then use a geo-coding provider, operated by the service 70 or some third party, to translate the location information (such as a street address) into a set of coordinates that can be used to query an aerial or satellite image database. Typically, the geo-coding provider will be used to translate the customer supplied street address into a set of longitude-latitude coordinates.

Next, the longitude-latitude coordinates of the property may be used to query an aerial and/or satellite imagery database in order to retrieve one or more images of the property of interest. It is important to note that horizontal (non-sloping) flat roofs only require a single image of the property. However, few roofs (especially those on residential buildings) are horizontally flat, and often contain one or more pitched sections. In such cases, two or more photographs are typically used in order for the service 70 to identify and measure all relevant sections and features of the roof.

Once the images of the roof section of the building are obtained, at least one of the images may be calibrated. During calibration, the distance in pixels between two points on the image is converted into a physical length. This calibration information is typically presented as a scale marker on the image itself, or as additional information supplied by the image database provider along with the requested image.

The image(s) and calibration information returned by the imagery database is entered or imported into measurement software of the service 70.

Next, a set of reference points may be identified in each of the images. The service's 70 measurement software then uses these reference points and any acceptable algorithm to co-register the images and reconstruct the three-dimensional geometry of the object identified by the reference points. There are a variety of photo-grammetric algorithms that can be utilized to perform this reconstruction. One such algorithm used by the service 70 uses photographs taken from two or more view points to "triangulate" points of interest on the object in three-dimensional ("3D") space. This triangulation can be visualized as a process of projecting a line originating from the location of the photograph's observation point that passes through a particular reference point in the image. The intersection of these projected lines from the set of observation points to a particular reference point identifies the location of that point in 3D space. Repeating the process for all such reference points allows the software to build a 3D model of the structure.

The optimal choice of reconstruction algorithm depends on a number of factors such as the spatial relationships between the photographs, the number and locations of the reference points, and any assumptions that are made about the geometry and symmetry of the object being reconstructed. Several such algorithms are described in detail in textbooks, trade journals, and academic publications.

Once the reconstruction of the building is complete, the results may be reviewed for completeness and correctness. If necessary, an operator of the service's 70 software will make corrections to the reconstructed model.

Information from the reconstructed model may then be used to generate a report containing information relevant to the customer. The information in the report may include total square footage, square footage and pitch of each section of roof, linear measurements of all roof segments, identification and measurement of ridges and valleys, and different elevation views rendered from the 3D model (top, side, front, etc).

Using the above description, a method for estimating the size and the repair or replacement costs of a roof may include the following steps:

a. selecting a roof estimation system that includes a computer with a roof estimation software program loaded into its working memory, said roof estimation software uses aerial image files of buildings in a selected region and a calibration module that allows the size, geometry, and orientation of a roof section to be determined from said aerial image files;

b. submitting a request for a measurement of a roof of a building at a known location;

c. submitting the location information of a building with a roof that needs a size determination, a repair estimate, or replacement estimate;

d. entering the location information of said building and obtaining aerial image files of one or more roof sections used on a roof; and, e. using said calibration module to determine the size, geometry and pitch of each said roof section.

In the above method, the entity requesting the measurement may be a roof construction/repair company, the building tenant, the building owner, an insurance company, etc.

FIG. 6 is a block diagram illustrating example functional elements of one embodiment of a roof estimation system. In particular, FIG. 6 shows an example Roof Estimation System ("RES") 600 comprising an image acquisition engine 601, a roof modeling engine 602, a report generation engine 603, image data 605, model data 606, and report data 607. The RES 600 is communicatively coupled to an image source 610, a customer 615, and optionally an operator 620. The RES 600 and its components may be implemented as part of a computing system, as will be further described with reference to FIG. 7.

In the illustrated embodiment, the RES 600 performs some or all of the functions of the whole system described with reference to FIGS. 1 and 2, and also additional functions as described below. For example, the RES 600 may perform one or more of the functions of the software program 50, the roof estimating entity 105, the aerial image file database 52, and/or the calibration module 56.

More specifically, in the illustrated embodiment of FIG. 6, the RES 600 is configured to generate a roof estimate report 632 for a specified building, based on aerial images 631 of the building received from the image source 610. The image source 610 may be any provider of images of the building for which a roof estimate is being generated. In one embodiment, the image source 610 includes a computing system that provides access to a repository of aerial images of one or more buildings. The image acquisition engine 601 obtains one or more aerial images of the specified building by, for example, providing an indicator of the location of the specified building (e.g., street address, GPS coordinates, lot number, etc.) to the image source 610. In response, the image source 610 provides to the image acquisition engine 605 the one or more aerial images of the building. The image acquisition engine 601 then stores the received aerial images as image data 605, for further processing by other components of the RES 600. In some embodiments, the aerial images may include images obtain via one or more ground-based platforms, such as a vehicle-mounted camera that obtains street-level images of buildings, a nearby building, a hilltop, etc. In some cases, a vehicle-mounted camera may be mounted in an elevated position, such as a boom.

Next, the roof modeling engine 602 generates a model of the roof of the specified building. In the illustrated embodiment, the roof modeling engine 602 generates a three-dimensional model, although in other embodiments, a two-dimensional (e.g., top-down roof plan) may be generated instead or in addition. As noted above, a variety of automatic and semi-automatic techniques may be employed to generate a model of the roof of the building. In one embodiment, generating such a model is based at least in part on a correlation between at least two of the aerial images of the building. For example, the roof modeling engine 602 receives an indication of a corresponding feature that is shown in each of the two aerial images. In one embodiment, an operator 620, viewing two or more images of the building, inputs an indication in at least some of the images, the indications identifying which points of the images correspond to each other for model generation purposes.

The corresponding feature may be, for example, a vertex of the roof of the building, the corner of one of the roof planes of the roof, a point of a gable or hip of the roof, etc. The corresponding feature may also be a linear feature, such as a ridge or valley line between two roof planes of the roof. In one embodiment, the indication of a corresponding feature on the building includes "registration" of a first point in a first aerial image, and a second point in a second aerial image, the first and second points corresponding the substantially the same point on the roof of the building. Generally, point registration may include the identification of any feature shown in both aerial images. Thus, the feature need not be a point on the roof of the building. Instead, it may be, for example, any point that is visible on both aerial images, such as on a nearby building (e.g., a garage, neighbor's building, etc.), on a nearby structure (e.g., swimming pool, tennis court, etc.), on a nearby natural feature (e.g., a tree, boulder, etc.), etc.

In some embodiments, the roof modeling engine 602 determines the corresponding feature automatically, such as by employing on one or more image processing techniques used to identify vertexes, edges, or other features of the roof. In other embodiments, the roof modeling engine 602 determines the corresponding feature by receiving, from the human operator 620 as operator input 633, indications of the feature shown in multiple images of the building.

In addition, generating a 3D model of the roof of a building may include correcting one or more of the aerial images for various imperfections. For example, the vertical axis of a particular aerial image sometimes will not substantially match the actual vertical axis of its scene. This will happen, for example, if the aerial images were taken at different distances from the building, or at a different pitch, roll, or yaw angles of the aircraft from which the images were produced. In such cases, an aerial image may be corrected by providing the operator 620 with a user interface control operable to adjust the scale and/or relative angle of the aerial image to correct for such errors. The correction may be either applied directly to the aerial image, or instead be stored (e.g., as an offset) for use in model generation or other functions of the RES 600.

Generating a 3D model of the roof of a building further includes the automatic or semi-automatic identification of features of the roof of the building. In one embodiment, one or more user interface controls may be provided, such that the operator 620 may indicate (e.g., draw, paint, etc.) various features of the roof, such as valleys, ridges, hips, vertexes, planes, edges, etc. As these features are indicated by the operator 620, a corresponding 3D model may be updated accordingly to include those features. These features are identified by the operator based on a visual inspection of the images and by providing inputs that identify various features as valleys, ridges, hips, etc. In some cases, a first and a second image view of the roof (e.g., a north and east view) are simultaneously presented to the operator 620, such that when the operator 620 indicates a feature in the first image view, a projection of that feature is automatically presented in the second image view. By presenting a view of the 3D model, simultaneously projected into multiple image views, the operator 620 is provided with useful visual cues as to the correctness of the 3D model and/or the correspondence between the aerial images.

In addition, generating a 3D model of the roof of a building may include determining the pitch of one or more of the sections of the roof. In some embodiments, one or more user interface controls are provided, such that the operator 620 may accurately determine the pitch of each of the one or more roof sections. An accurate determination of the roof pitch may be employed (by a human or the RES 600) to better determine an accurate cost estimate, as roof sections having a low pitch are typically less costly surfaces to repair and/or replace.

The generated 3D model typically includes a plurality of planar roof sections that each correspond to one of the planar sections of the roof of the building. Each of the planar roof sections in the model has a number of associated dimensions and/or attributes, among them slope, area, and length of each edge of the roof section. Other information may include, whether a roof section edge is in a valley or on a ridge of the roof, the orientation of the roof section, and other information relevant to roof builder (e.g., roof and/or roof section perimeter dimensions and/or outlines). Once a 3D model has been generated to the satisfaction of the roof modeling engine 602 and/or the operator 620, the generated 3D model is stored as model data 606 for further processing by the RES 600. In one embodiment, the generated 3D model is then stored in a quality assurance queue, from which it is reviewed and possibly corrected by a quality control operator.

The report generation engine 603 generates a final roof estimate report based on a 3D model stored as model data 606, and then stores the generated report as report data 607. Such a report typically includes one or more plan (top-down) views of the 3D model, annotated with numerical values for the slope, area, and/or lengths of the edges of at least some of the plurality of planar roof sections of the 3D model of the roof. For example, the example report of FIGS. 5A-5E includes multiple plan views of a generated 3D model of the house 103c. In particular, FIG. 5C shows a first plan view of the 3D model, annotated with dimensions of the edges of each roof section. FIG. 5D shows a second plan view of the same 3D model, annotated with the slope of each roof section. FIG. 5E shows a third plan view of the same 3D model, annotated with the area of each roof section.

In some embodiments, generating a report includes labeling one or more views of the 3D model with annotations that are readable to a human user. Some 3D models include a large number of small roof details, such as dormers or other sections, such that applying uniformly sized, oriented, and positioned labels to roof section views results in a visually cluttered diagram. Accordingly, various techniques may be employed to generate a readable report, including automatically determining an optimal or near-optimal label font size, label position, and/or label orientation, such that the resulting report may be easily read and understood by the customer 615.

In addition, in some embodiments, generating a report includes automatically determining a cost estimate, based on specified costs, such as those of materials, labor, transportation, etc. For example, the customer 615 provides indications of material and labor costs to the RES 600. In response, the report generation engine 603 generates a roof estimate report that includes a cost estimate, based on the costs provided by the customer 615 and the attributes of the particular roof, such as area, pitch, etc.

In one embodiment, the generated report is then provided to a customer. The generated report can be represented, for example, as an electronic file (e.g., a PDF file) or a paper document. In the illustrated example, roof estimate report 632 is transmitted to the customer 615. The customer 615 may be or include any human, organization, or computing system that is the recipient of the roof estimate report 632.

The customer 615 may be a property owner, a property manager, a roof construction/repair company, a general contractor, an insurance company, a solar power panel installer, etc. Reports may be transmitted electronically, such as via a network (e.g., as an email, Web page, etc.) or by some shipping mechanism, such as the postal service, a courier service, etc.

In some embodiments, one or more of the 3D models stored as model data 606 are provided directly to the customer, without first being transformed into a report. For example, a 3D model may be exported as a data file, in any acceptable format, that may be consumed or otherwise utilized by some other computing system, such as computer-aided design ("CAD") tool, drawing program, etc.

Figure 7:
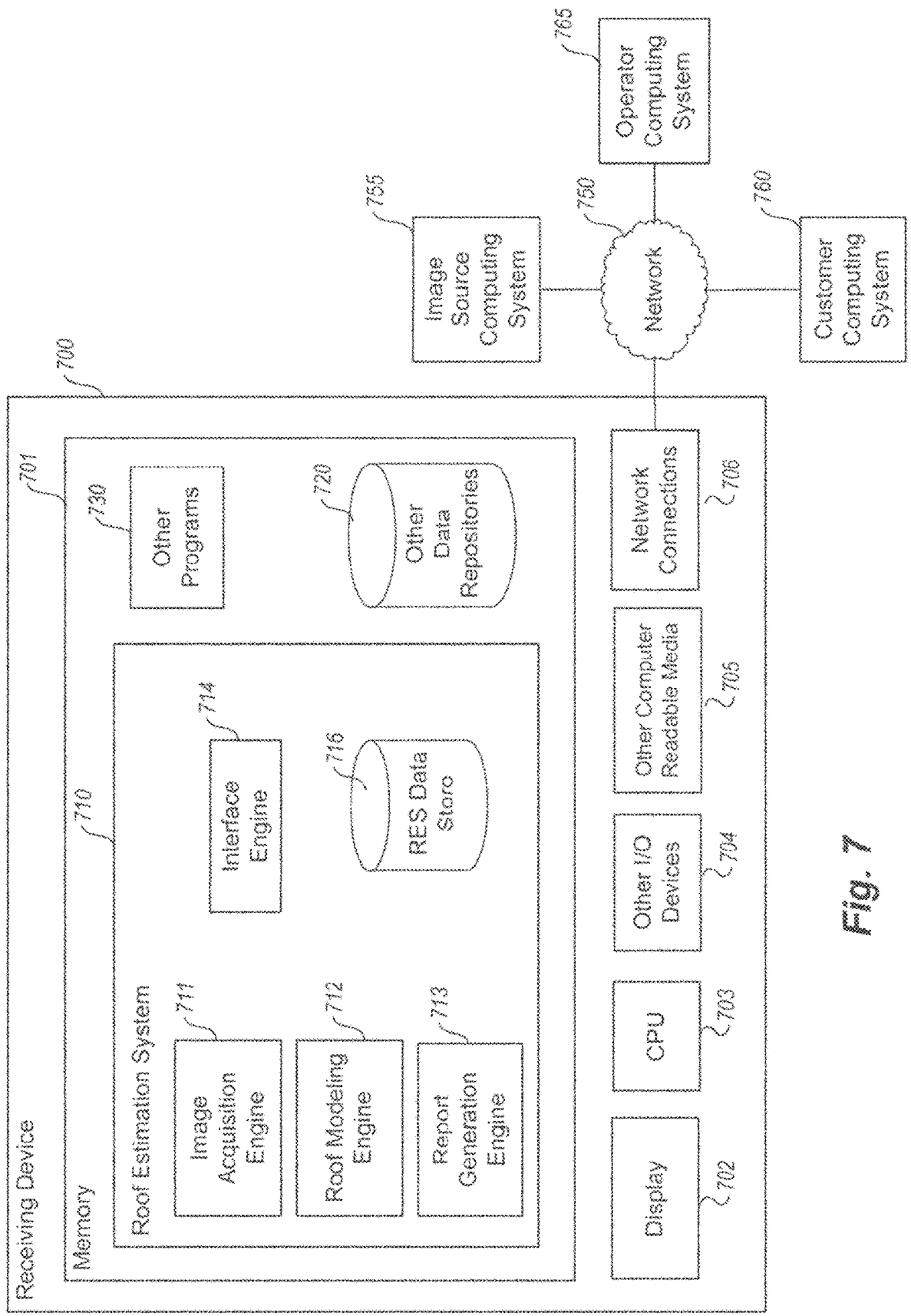
FIG. 7 is an example block diagram of a computing system for practicing embodiments of a roof estimation system.

FIG. 7 is an example block diagram of a computing system for practicing embodiments of a roof estimation system. FIG. 7 shows a computing system 700 that may be utilized to implement a Roof Estimation System ("RES") 710. One or more general purpose or special purpose computing systems may be used to implement the RES 710. More specifically, the computing system 700 may comprise one or more distinct computing systems present at distributed locations. In addition, each block shown may represent one or more such blocks as appropriate to a specific embodiment or may be combined with other blocks. Moreover, the various blocks of the RES 710 may physically reside on one or more machines, which use standard inter-process communication mechanisms (e.g., TCP/IP) to communicate with each other. Further, the RES 710 may be implemented in software, hardware, firmware, or in some combination to achieve the capabilities described herein.

In the embodiment shown, computing system 700 comprises a computer memory ("memory") 701, a display 702, one or more Central Processing Units ("CPU") 703, Input/Output devices 704 (e.g., keyboard, mouse, CRT or LCD display, and the like), other computer-readable media 705, and network connections 706. The RES 710 is shown residing in memory 701. In other embodiments, some portion of the contents, some of, or all of the components of the RES 710 may be stored on and/or transmitted over the other computer-readable media 705. The components of the RES 710 preferably execute on one or more CPUs 703 and generate roof estimate reports, as described herein. Other code or programs 730 (e.g., a Web server, a database management system, and the like) and potentially other data repositories, such as data repository 720, also reside in the memory 710, and preferably execute on one or more CPUs 703. Not all of the components in FIG. 7 are required for each implementation. For example, some embodiments embedded in other software do not provide means for user input, for display, for a customer computing system, or other components.

In a typical embodiment, the RES 710 includes an image acquisition engine 711, a roof modeling engine 712, a report generation engine 713, an interface engine 714, and a roof estimation system data repository 716. Other and/or different modules may be implemented. In addition, the RES 710 interacts via a network 750 with an image source computing system 755, an operator computing system 765, and/or a customer computing system 760.

The image acquisition engine 711 performs at least some of the functions of the image acquisition engine 601 described with reference to FIG. 6. In particular, the image acquisition engine 711 interacts with the image source computing system 755 to obtain one or more images of a building, and stores those images in the RES data repository 716 for processing by other components of the RES 710. In some embodiments, the image acquisition engine 711 may act as an image cache manager, such that it preferentially provides images to other components of the RES 710 from the RES data repository 716, while obtaining images from the image source computing system 755 when they are not already present in the RES data repository 716.

The roof modeling engine 712 performs at least some of the functions of the roof modeling engine 602 described with reference to FIG. 6. In particular, the roof modeling engine 712 generates a 3D model based on one or more images of a building that are obtained from the RES data repository 716. As noted, 3D model generation may be performed semi-automatically, based on at least some inputs received from the computing system 765. In addition, at least some aspects of the 3D model generation may be performed automatically, based on image processing and/or image understanding techniques. After the roof modeling engine 712 generates a 3D model, it stores the generated model in the RES data repository 716 for further processing by other components of the RES 710.

The report generation engine 713 performs at least some of the functions of the report generation engine 603 described with reference to FIG. 6. In particular, the report generation engine 713 generates roof reports based on 3D models stored in the RES data repository 716. Generating a roof report may include preparing one or more views of a given 3D model of a roof, annotating those views with indications of various characteristics of the model, such as dimensions of sections or other features (e.g., ridges, valleys, etc.) of the roof, slopes of sections of the roof, areas of sections of the roof, etc.

The interface engine 714 provides a view and a controller that facilitate user interaction with the RES 710 and its various components. For example, the interface engine 714 provides an interactive graphical user interface that can be used by a human user operating the operator computing system 765 to interact with, for example, the roof modeling engine 612, to perform functions related to the generation of 3D models, such as point registration, feature indication, pitch estimation, etc. In other embodiments, the interface engine 714 provides access directly to a customer operating the customer computing system 760, such that the customer may place an order for a roof estimate report for an indicated building location. In at least some embodiments, access to the functionality of the interface engine 714 is provided via a Web server, possibly executing as one of the other programs 730.

In some embodiments, the interface engine 714 provides programmatic access to one or more functions of the RES 710. For example, the interface engine 714 provides a programmatic interface (e.g., as a Web service, static or dynamic library, etc.) to one or more roof estimation functions of the RES 710 that may be invoked by one of the other programs 730 or some other module. In this manner, the interface engine 714 facilitates the development of third-party software, such as user interfaces, plug-ins, adapters (e.g., for integrating functions of the RES 710 into desktop applications, Web-based applications, embedded applications, etc.), and the like. In addition, the interface engine 714 may be in at least some embodiments invoked or otherwise accessed via remote entities, such as the operator computing system 765, the image source computing system 755, and/or the customer computing system 760, to access various roof estimation functionality of the RES 710.

The RES data repository 716 stores information related the roof estimation functions performed by the RES 710. Such information may include image data 605, model data 606, and/or report data 607 described with reference to FIG. 6. In addition, the RES data repository 716 may include information about customers, operators, or other individuals or entities associated with the RES 710.

In an example embodiment, components/modules of the RES 710 are implemented using standard programming techniques. For example, the RES 710 may be implemented as a "native" executable running on the CPU 703, along with one or more static or dynamic libraries. In other embodiments, the RES 710 is implemented as instructions processed by virtual machine that executes as one of the other programs 730. In general, a range of programming languages known in the art may be employed for implementing such example embodiments, including representative implementations of various programming language paradigms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Python, JavaScript, VBScript, and the like), declarative (e.g., SQL, Prolog, and the like).

The embodiments described above may also use well-known synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments execute concurrently and asynchronously, and communicate using message passing techniques. Equivalent synchronous embodiments are also supported by an RES implementation. Also, other functions could be implemented and/or performed by each component/module, and in different orders, and by different components/modules, yet still achieve the functions of the RES.

In addition, programming interfaces to the data stored as part of the RES 710, such as in the RES data repository 716, can be available by standard mechanisms such as through C, C++, C#, and Java APIs; libraries for accessing files, databases, or other data repositories; through scripting languages such as XML; or through Web servers, FTP servers, or other types of servers providing access to stored data. For example, the RES data repository 716 may be implemented as one or more database systems, file systems, memory buffers, or any other technique for storing such information, or any combination of the above, including implementations using distributed computing techniques.

Also, the example RES 710 can be implemented in a distributed environment comprising multiple, even heterogeneous, computer systems and networks. For example, in one embodiment, the image acquisition engine 711, the roof modeling engine 712, the report generation engine 713, the interface engine 714, and the data repository 716 are all located in physically different computer systems. In another embodiment, various modules of the RES 710 are hosted each on a separate server machine and are remotely located from the tables which are stored in the data repository 716. Also, one or more of the modules may themselves be distributed, pooled or otherwise grouped, such as for load balancing, reliability or security reasons. Different configurations and locations of programs and data are contemplated for use with techniques of described herein. A variety of distributed computing techniques are appropriate for implementing the components of the illustrated embodiments in a distributed manner including but not limited to TCP/IP sockets, RPC, RMI, HTTP, Web Services (XML-RPC, JAX-RPC, SOAP, and the like).

Furthermore, in some embodiments, some or all of the components of the RES are implemented or provided in other manners, such as at least partially in firmware and/or hardware, including, but not limited to one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), and the like Some or all of the system components and/or data structures may also be stored (e.g., as software instructions or structured data) on a computer-readable medium, such as a hard disk, a memory, a network, or a portable media article to be read by an appropriate drive or via an appropriate connection. The system components and data structures may also be stored as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

Figure 8:
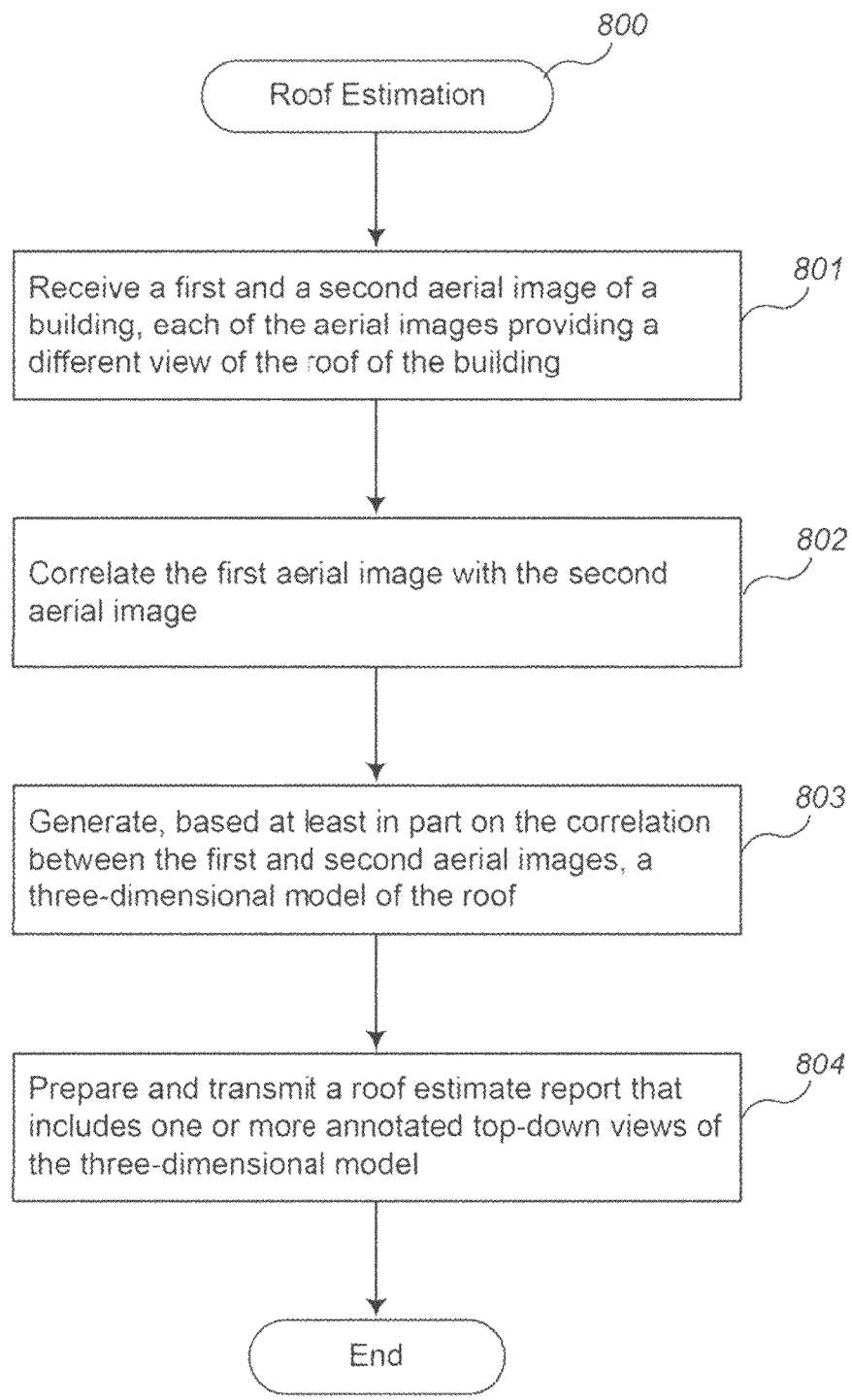
FIG. 8 is an example flow diagram of a first example roof estimation routine provided by an example embodiment.

FIG. 8 is an example flow diagram of a first example roof estimation routine provided by an example embodiment. The illustrated routine 800 may be provided by, for example, execution of the roof estimation system 710 described with respect to FIG. 7. The illustrated routine 800 generates a 3D model of a roof of a building, based on two or more aerial images of the building, and further prepares and transmits a roof estimate report based on the 3D model.

More specifically, the routine begins at step 801 where it receives a first and a second aerial image of a building, each of the aerial images providing a different view of the roof of the building. The aerial images may be received from, for example, the image source computing system 755 and/or from the RES data repository 716 described with reference to FIG. 7. As discussed above, aerial images may be originally created by cameras mounted on airplanes, balloons, satellites, etc. In some embodiments, images obtained from ground-based platforms (e.g., vehicle-mounted cameras) may be used instead or in addition.

In step 802, the routine correlates the first aerial image with the second aerial image. In some embodiments, correlating the aerial images may include registering pairs of points on the first and second aerial images, each pair of points corresponding to substantially the same point on the roof depicted in each of the images. Correlating the aerial images may be based at least in part on input received from a human operator and/or automatic image processing techniques.

In step 803, the routine generates, based at least in part on the correlation between the first and second aerial images, a three-dimensional model of the roof. The three-dimensional model of the roof may include a plurality of planar roof sections that each have a corresponding slope, area, and perimeter. Generating the three-dimensional model may be based at least in part indications of features of the roof, such as valleys, ridges, edges, planes, etc. Generating the three-dimensional model may also be based at least in part on input received from a human operator (e.g., indications of roof ridges and valleys) and/or automatic image processing techniques.

In step 804, the routine prepares (e.g., generates, determines, produces, etc.) and transmits a roof estimate report that includes one or more annotated top-down views of the three-dimensional model. In some embodiments, the annotations include numerical values indicating the slope, area, and lengths of the edges of the perimeter of at least some of the plurality of planar roof sections of the three-dimensional model of the roof. The roof estimate report may be an electronic file that includes images of the building and/or its roof, as well as line drawings of one or more views of the three-dimensional model of the building roof. Preparing the report may include annotating the report with labels that are sized and oriented in a manner that preserves and/or enhances readability of the report. For example, labels on a particular line drawing may be sized based at least in part on the size of the feature (e.g., roof ridge line) that they are associated with, such that smaller features are annotated with smaller labels so as to preserve readability of the line drawing by preventing or reducing the occurrence of labels that overlap with other portions (e.g., lines, labels, etc.) of the line drawing. The roof estimate report may be transmitted to various destinations, such as directly to a customer or computing system associated with that customer, a data repository, and/or a quality assurance queue for inspection and/or improvement by a human operator.

After step 804, the routine ends. In other embodiments, the routine may instead return to step 801, to generate another roof estimate report for another building. Note that the illustrated routine may be performed interactively, such as based at least in part on one or more inputs received from a human operator, or in batch mode, such as for performing automatic, bulk generation of roof estimate reports.

Figure 9:
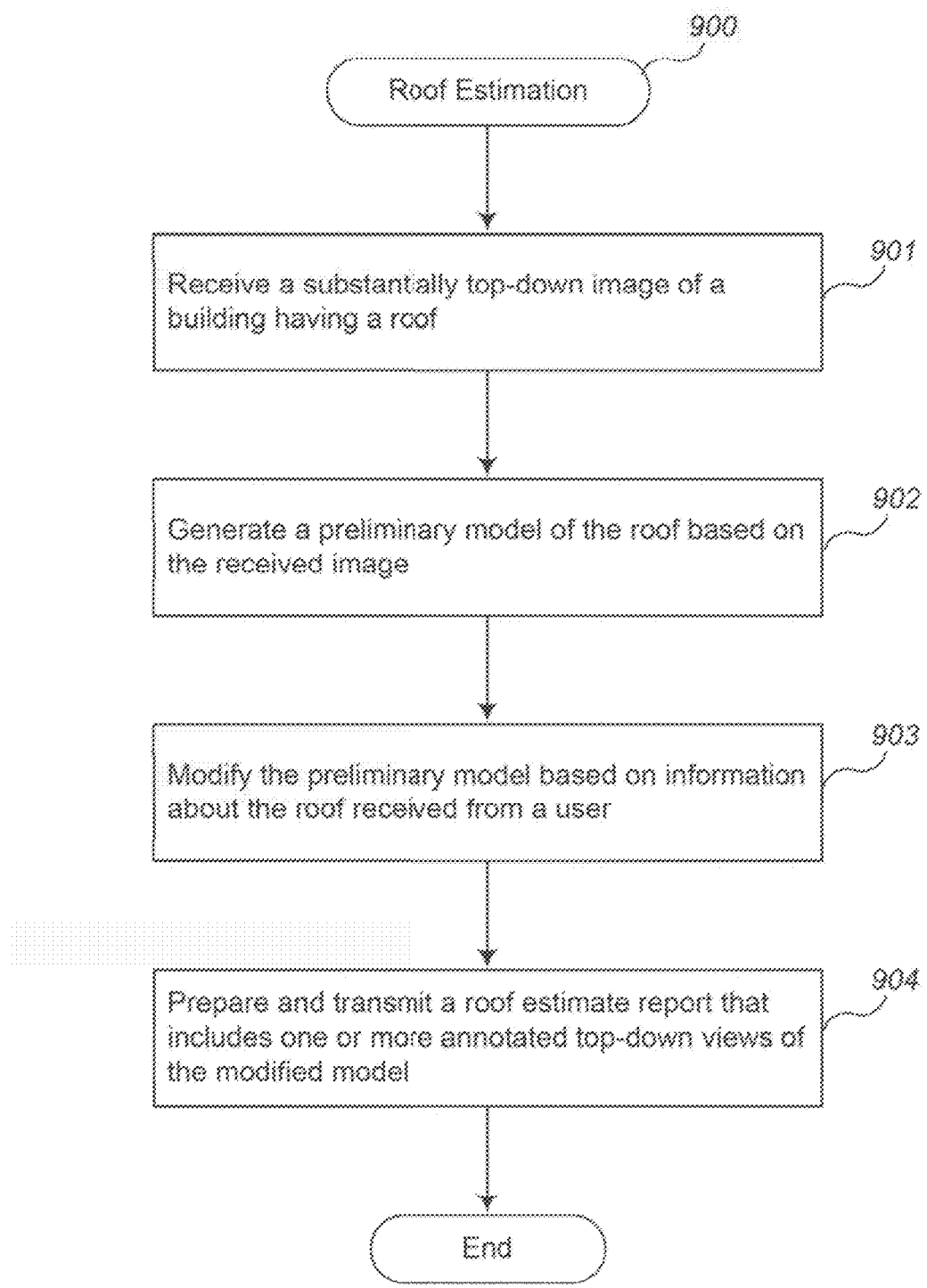
FIG. 9 is an example flow diagram of a second example roof estimation routine provided by an example embodiment.

FIG. 9 is an example flow diagram of a second example roof estimation routine provided by an example embodiment. The illustrated routine 900 may be provided by, for example, execution of the roof estimation system 710 described with respect to FIG. 7. The illustrated routine 900 generates a roof estimate report based on a single aerial image and additional information received from a user, such as information about the pitch of various roof sections.

In step 901, the routine receives a substantially top-down aerial image of a building having a roof. Such an aerial image may be obtained from, for example, a satellite or aircraft.

In step 902, the routine generates a preliminary model of the roof based on the received aerial image. The preliminary roof model may be a two-dimensional ("flat") model that includes information about the perimeter of the roof and at least some of its corresponding planar roof sections. Such a preliminary roof model may include estimates of various dimensions of the roof, such as edge lengths and/or section areas. In some cases, the preliminary roof model does not include information related to the pitch of various roof sections.

In step 903, the routine modifies the preliminary model based on additional information about the roof received from a user. For example, the preliminary model may be presented to a user (e.g., a customer, an operator, etc.), by displaying a representation of the model, such as a line drawing. In response, the user provides the routine with pitch information and/or feature identification (e.g., of ridges and/or valleys), etc. Such user-supplied information is then incorporated into the preliminary roof model to obtain a modified (refined) roof model. In some cases, the user supplies the additional information via a Web-base interface that provides access to the routine.

In step 904, the routine prepares and transmits a roof estimate report that includes one or more annotated views of the modified model. As discussed above, the annotations may include numerical values indicating the slope, area, and lengths of the edges of the perimeter of at least some of the roof sections of the roof. After step 904, the routine ends.

The routines 800 and 900 may be used in conjunction to advantageously offer customers roof estimate reports at differing price points. For example, routine 800 can be utilized as part of a "premium" service that offers a customer with a more accurate roof estimate report for minimal effort on the customer's part. Routine 900 can be utilized as part of an "economy" service that offers a customer a less accurate roof estimate report at a lower price, but that may be further refined with additional effort from the customer.

From the foregoing it will be appreciated that, although specific embodiments have been described herein for purposes of illustration, various modifications may be made without deviating from the spirit and scope of the present disclosure. For example, the methods, systems, and techniques for generating and providing roof estimate reports discussed herein are applicable to other architectures other than the illustrated architecture or a particular roof estimation system implementation. Also, the methods and systems discussed herein are applicable to differing network protocols, communication media (optical, wireless, cable, etc.) and devices (such as wireless handsets, electronic organizers, personal digital assistants, portable email machines, game machines, pagers, navigation devices such as GPS receivers, etc.). Further, the methods and systems discussed herein may be utilized by and/or applied to other contexts or purposes, such as by or for solar panel installers, roof gutter installers, awning companies, HVAC contractors, general contractors, and/or insurance companies.

The invention claimed is:

1. A system, comprising:
    a computing system storing software instructions that when executed cause the computing system to:
        receive a first aerial image of a building having a roof;
        receive a second aerial image of the building having the roof, the first and second aerial images of the building having been taken independent of each other, the first and second aerial images of the building providing different views of the roof from each other;
        calibrate at least one of the first and second aerial images of the building using calibration information received from a calibration module;
        correlate, without using a preexisting three-dimensional model of the building, the first aerial image of the building with the second aerial image of the building, the correlating employing one or more image processing technique to identify vertexes, edges, or other features of the roof to register pairs of points on the first and second aerial images of the building, each pair of points corresponding to a same point on the roof depicted in each of the first and second aerial images of the building;
        generate, without using a preexisting three-dimensional model of the building, based at least in part on the correlation of the first and second aerial images of the building, a three-dimensional model of the roof that includes a plurality of planar roof sections that each have a corresponding pitch, area, and edges;
        determine a pitch of a plurality of the planar roof sections of the roof; and generate a roof estimate report that includes at least one top plan view of the three-dimensional model annotated with numerical indications of the determined pitch.

2. The system of claim 1, wherein the first aerial image depicts a top plan view of the roof.

3. The system of claim 1, wherein the second aerial image depicts an oblique perspective view of the roof.

4. The system of claim 1, wherein the first aerial image and the second aerial image are not a stereoscopic pair.

5. The system of claim 1, having software instructions that when executed cause the computing system to:
receive a third aerial image of the building having the roof, the third aerial image depicting a different view of the roof than the first aerial image and the second aerial image; and
correlate the first aerial image with the third aerial image; and
wherein generating the three-dimensional model of the roof is based further at least in part on the correlation of the first and third aerial images.

6. The system of claim 5, wherein the third aerial image depicts another oblique perspective view of the roof.

7. The system of claim 1, having software instructions that when executed cause the computing system to:
determine a direction of the pitch for each of the plurality of sections of the roof for which a pitch was determined.

8. The system of claim 7, wherein the roof estimate report includes the determined direction of the pitch for each of the plurality of sections of the roof for which a pitch was determined.

9. The system of claim 1, wherein the roof estimate report includes an image of the building and one or more line drawings of the three-dimensional model.

10. The system of claim 1, having software instructions that when executed cause the computing system to:
receive a location of the building; and
query an imagery database for the first aerial image and the second aerial image based on the location of the building.

11. The system of claim 1, wherein generating the three-dimensional model of the roof is based further at least in part on receiving operator indications of one or more features of the roof.

12. The system of claim 11, wherein the features of the roof include one or more of a valley, a ridge, a hip, a vertex, a plane, and an edge.

13. The system of claim 1, wherein the three-dimensional model of the roof includes roof attributes associated with the planar roof sections, the roof attributes comprising one or more area of the planar roof sections and/or one or more length of edges of the planar roof sections.

14. The system of claim 13, wherein the roof estimate report includes one or more of the roof attributes.

15. The system of claim 1, wherein the three-dimensional model of the roof includes roof information associated with the planar roof sections, the roof information comprising one or more of: a location of an edge of a planar roof section as in a valley of the roof; a location of an edge of a planar roof section as on a ridge of the roof; an orientation of a planar roof section; a perimeter dimension of a planar roof section; a perimeter dimension of the roof; an outline of a planar roof section; and an outline of the roof.

16. The system of claim 15, wherein the roof estimate report includes the roof information associated with the planar roof sections.

* * * * *